United States Patent
Yamazaki et al.

(10) Patent No.: US 7,297,978 B2
(45) Date of Patent: *Nov. 20, 2007

(54) SEMICONDUCTOR THIN FILM AND SEMICONDUCTOR DEVICE

(75) Inventors: Shunpei Yamazaki, Setagaya (JP); Hisashi Ohtani, Atsugi (JP); Toru Mitsuki, Atsugi (JP); Akiharu Miyanaga, Atsugi (JP); Yasushi Ogata, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/983,782

(22) Filed: Nov. 9, 2004

(65) Prior Publication Data

US 2005/0092997 A1    May 5, 2005

Related U.S. Application Data

(62) Division of application No. 10/295,882, filed on Nov. 18, 2002, now Pat. No. 6,822,262, which is a division of application No. 09/592,936, filed on Jun. 13, 2000, now Pat. No. 6,495,886, which is a division of application No. 09/120,290, filed on Jul. 22, 1998, now Pat. No. 6,087,679.

(30) Foreign Application Priority Data

Jul. 23, 1997 (JP) ............................. 09-212428
Apr. 3, 1998 (JP) ............................. 10-108552
May 16, 1998 (JP) ............................. 10-152308

(51) Int. Cl.
*H01L 29/04* (2006.01)
*H01L 29/76* (2006.01)

(52) U.S. Cl. ............. 257/59; 257/72; 257/64; 257/65; 257/66; 257/69; 257/70; 257/E27.112

(58) Field of Classification Search ......... 257/59, 257/64–66, 69–70, 347, 72, E27.112; 438/48, 438/128, 149, 151, 157, 283
See application file for complete search history.

(56) References Cited

U.S. PATENT DOCUMENTS 3,922,475 A * 11/1975 Manasevit ............. 428/700
4,538,279 A    8/1985 Keller
4,727,044 A    2/1988 Yamazaki (Continued)

FOREIGN PATENT DOCUMENTS

DE    198 25 081    12/1998

(Continued)

*Primary Examiner*—Jerome Jackson
*Assistant Examiner*—Joseph Nguyen
(74) *Attorney, Agent, or Firm*—Eric J. Robinson; Robinson Intellectual Property Law Office, P.C.

(57) ABSTRACT

After an amorphous semiconductor thin film is crystallized by utilizing a catalyst element, the catalyst element is removed by performing a heat treatment in an atmosphere containing a halogen element. A resulting crystalline semiconductor thin film exhibits {110} orientation. Since individual crystal grains have approximately equal orientation, the crystalline semiconductor thin film has substantially no grain boundaries and has such crystallinity as to be considered a single crystal or considered so substantially.

24 Claims, 20 Drawing Sheets

U.S. PATENT DOCUMENTS

| | | |
|---|---|---|
| 4,959,700 A | 9/1990 | Yamazaki |
| 5,142,344 A | 8/1992 | Yamazaki |
| 5,153,702 A | 10/1992 | Aoyama et al. |
| 5,313,077 A | 5/1994 | Yamazaki |
| 5,403,772 A | 4/1995 | Zhang et al. |
| 5,426,064 A | 6/1995 | Zhang et al. |
| 5,426,340 A * | 6/1995 | Higaki et al. ........... 310/313 R |
| 5,477,808 A | 12/1995 | Olekrug et al. |
| 5,481,121 A | 1/1996 | Zhang et al. |
| 5,488,000 A | 1/1996 | Zhang et al. |
| 5,492,843 A | 2/1996 | Adachi et al. |
| 5,501,989 A | 3/1996 | Takayama et al. |
| 5,508,533 A | 4/1996 | Takemura |
| 5,529,937 A | 6/1996 | Zhang et al. |
| 5,534,716 A | 7/1996 | Takemura |
| 5,543,352 A | 8/1996 | Ohtani et al. |
| 5,543,636 A | 8/1996 | Yamazaki |
| 5,563,426 A | 10/1996 | Zhang et al. |
| 5,569,610 A | 10/1996 | Zhang et al. |
| 5,569,936 A | 10/1996 | Zhang et al. |
| 5,580,792 A | 12/1996 | Zhang et al. |
| 5,581,092 A | 12/1996 | Takemura |
| 5,585,291 A | 12/1996 | Ohtani et al. |
| 5,589,694 A | 12/1996 | Takayama et al. |
| 5,595,923 A | 1/1997 | Zhang et al. |
| 5,595,944 A | 1/1997 | Zhang et al. |
| 5,604,360 A | 2/1997 | Zhang et al. |
| 5,605,846 A | 2/1997 | Ohtani et al. |
| 5,606,179 A | 2/1997 | Yamazaki et al. |
| 5,608,232 A | 3/1997 | Yamazaki et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,619,044 A * | 4/1997 | Makita et al. ................ 257/64 |
| 5,620,910 A | 4/1997 | Teramoto |
| 5,621,224 A | 4/1997 | Yamazaki et al. |
| 5,624,851 A | 4/1997 | Takayama et al. |
| 5,633,738 A * | 5/1997 | Wakui et al. .................. 349/46 |
| 5,637,515 A | 6/1997 | Takemura |
| 5,639,698 A | 6/1997 | Yamazaki et al. |
| 5,643,826 A | 7/1997 | Ohtani et al. |
| 5,646,424 A | 7/1997 | Zhang et al. |
| 5,654,203 A | 8/1997 | Ohtani et al. |
| 5,656,825 A | 8/1997 | Kasumoto et al. |
| 5,663,077 A | 9/1997 | Adachi et al. |
| 5,663,592 A | 9/1997 | Miyanaga et al. |
| 5,677,549 A | 10/1997 | Takayama et al. |
| 5,696,386 A | 12/1997 | Yamazaki et al. |
| 5,696,388 A | 12/1997 | Funada et al. |
| 5,700,333 A | 12/1997 | Yamazaki et al. |
| 5,705,829 A | 1/1998 | Miyanaga et al. |
| 5,710,050 A | 1/1998 | Makita et al. |
| 5,712,191 A | 1/1998 | Nakajima et al. |
| 5,719,408 A | 2/1998 | Yamamoto et al. |
| 5,734,763 A * | 3/1998 | Chang ........................ 385/11 |
| 5,744,824 A | 4/1998 | Kousai et al. |
| 5,818,076 A | 10/1998 | Zhang et al. |
| 5,882,960 A | 3/1999 | Zhang et al. |
| 5,895,933 A | 4/1999 | Zhang et al. |
| 5,933,783 A * | 8/1999 | Kawakami et al. ......... 455/566 |
| 6,037,610 A | 3/2000 | Zhang et al. |
| 6,133,557 A * | 10/2000 | Kawanabe et al. ......... 219/544 |
| 6,307,214 B1 | 10/2001 | Ohtani et al. |
| 6,730,549 B1 | 5/2004 | Zhang et al. |
| 6,756,657 B1 | 6/2004 | Zhang et al. |
| 2003/0145784 A1* | 8/2003 | Thompson et al. ........... 117/92 |
| 2004/0180477 A1 | 9/2004 | Zhang et al. |

FOREIGN PATENT DOCUMENTS

| | | |
|---|---|---|
| EP | 0 631 325 | 12/1994 |
| JP | 5-327398 | * 12/1993 |
| JP | 7-159772 | * 12/1993 |
| KR | 171235 | 3/1999 |
| KR | 299721 | 12/2001 |

* cited by examiner

FIG. 1A
FIG. 1B
PRIOR ART
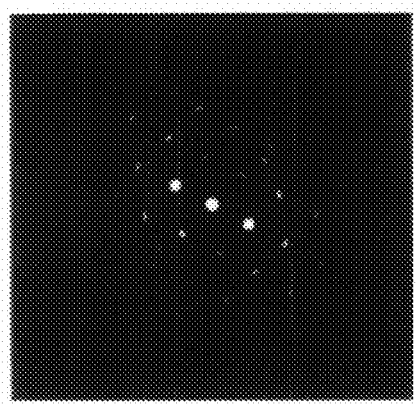
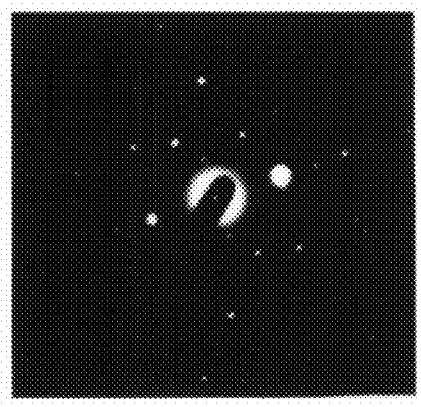

0.1μm 0.1μm

5nm

5nm 50 nm

<Point 1>

5 nm 50 nm

<Point 2>

5 nm 50 nm

<Point 3>

5 nm

SEMICONDUCTOR THIN FILM AND SEMICONDUCTOR DEVICE

This application is a Divisional of U.S application Ser. No. 10/295,882 filed on Nov. 18, 2002, now U.S. Pat. No. 6,822,262, which is a Divisional of U.S. application Ser. No. 09/592,936 filed on Jun. 13, 2000, now U.S. Pat. No. 6,495,886, which is a Divisional of U.S. application Ser. No. 09/120,290 filed on Jul. 22, 1998, now U.S. Pat. No. 6,087,679.

BACKGROUND OF THE INVENTION

1. Field of the Invention

The present invention relates to a semiconductor thin film formed on a substrate having an insulating surface and a semiconductor device using such a semiconductor thin film as its active layer. In particular, the invention relates to such a semiconductor thin film and semiconductor device in which the semiconductor thin film is made of a material having silicon as the main component.

Further, the invention relates to a semiconductor circuit and an electro-optical device that are constituted of semiconductor devices such as thin-film transistors as well as to an electronic apparatus using such a semiconductor circuit and electro-optical device.

In this specification, the term "semiconductor device" is used as including all of the above-mentioned thin-film transistor, semiconductor circuit, electro-optical device, and electronic apparatus; that is, all of devices and apparatuses that function by utilizing a semiconductor characteristic are called semiconductor devices. Therefore, the semiconductor devices recited in the claims are not limited to single elements such as a thin-film transistor and encompass semiconductor circuits and electro-optical devices that are constructed by integrating such single elements as well as electronic apparatuses using such a semiconductor circuit or electro-optical device as a part.

2. Description of the Related Art

In recent years, the techniques of forming thin-film transistors (TFTs) by using a semiconductor thin film (thickness: tens to hundreds of nanometers) formed on a substrate having an insulating surface have attracted much attention. Thin-film transistors particularly as switching elements of image display devices such as liquid crystal display devices are now being developed at high speed.

For example, in liquid crystal display devices, it is attempted to apply TFTs to every kind of electric circuit such as a pixel matrix circuit in which pixel regions arranged in matrix form are controlled individually, a driver circuit for controlling a pixel matrix circuit, or a logic circuit (an operation circuit, a memory circuit, a clock generator, or the like) for processing an external data signal.

At present, TFTs using an amorphous silicon film as an active layer have been put into practical use. However, TFTs using a crystalline silicon film such as a polysilicon film are necessary for electric circuits, such as a driver circuit and a logic circuit, that are required to operate at even higher speed.

For example, techniques of the present assignee that are disclosed in Japanese Laid-open Patent Publication Nos. Hei. 7-130652 and Hei. 8-78329 are known as methods for forming a crystalline silicon film on a glass substrate. The disclosures of which are incorporated herein by reference. By utilizing a catalyst element for accelerating crystallization of an amorphous silicon film, the techniques of these publications enable formation of a crystalline silicon film having superior crystallinity by a heat treatment of 500°-600° and about 4 hours.

In particular, the technique of the publication No. 8-78329 is such that the above technique is utilized to cause crystal growth in a direction approximately parallel with the substrate surface. The present inventors especially call a resulting crystallized region a "lateral growth region."

However, even a driver circuit that is constructed by using such TFTs cannot completely provide required performance. In particular, at present, it is impossible to construct, by using conventional TFTs, high-speed logic circuits that are required to operate at extremely high speed (megahertz to gigahertz).

To improve the crystallinity of a crystalline silicon film having grain boundaries (called a polysilicon film), the inventors have repeated trial and error as exemplified by a semi-amorphous semiconductor (Japanese Laid-open Patent Publication No. Sho. 57-160121 etc.) and a monodomain semiconductor (Japanese Laid-open Patent Publication No. Hei. 8-139019). The disclosures of which are incorporated herein by reference.

SUMMARY OF THE INVENTION

The concept common to the semiconductor films described in the above publications is to make grain boundaries substantially harmless. That is, the most important object was to substantially eliminate grain boundaries to thereby enable smooth movement of carriers (electrons or holes).

However, the semiconductor films described in the above publications are still insufficient to allow logic circuits to perform required high-speed operation. That is, to realize a system-on-panel incorporating logic circuits, it is necessary to develop a material that is not known, i.e., an entirely new material.

An object of the present invention is to satisfy the above requirement, that is, to provide a semiconductor thin film capable of realizing a semiconductor device having extremely high performance that allows construction of such a high-speed logic circuit as conventional TFTs cannot provide. Also, another object of the present invention is to provide a semiconductor device using the semiconductor thin film described above.

The invention provides a semiconductor thin film which is a collected body of a plurality of rod-like or flat-rod-like crystals each having silicon as the main component, wherein the main orientation plane approximately coincides with the {110} plane; the concentration, in the semiconductor thin film, of each of carbon and nitrogen is $5\times10^{17}$ atoms/cm$^3$ or less and the concentration of oxygen is $1\times10^{18}$ atoms/cm$^3$ or less; and the rod-like or flat-rod-like crystals contact each other while forming rotation angles having absolute values that are within 3°.

The above semiconductor thin film may be such that an electron beam diffraction pattern of the semiconductor thin film has particular regularity due to {110} orientation, that each of diffraction spots of the electron beam diffraction pattern is approximately circular, and that the ratio of the minor-axis length to the major-axis length of each of the diffraction spots is in a range of 1/1 to 1/1.5.

The above semiconductor thin film may be such that an electron beam diffraction pattern of the semiconductor thin film has particular regularity due to {110} orientation, that each of diffraction spots of the electron beam diffraction pattern has a spread that is on a circle having its center at the central point of an electron beam irradiation area, and that a tangential line to each of the diffraction spot from the central point of the electron beam irradiation area and a line segment connecting the central point of the electron beam irradiation area and the central point of the diffraction spot form an angle that is within ±1.5°.

BRIEF DESCRIPTION OF THE DRAWINGS

FIGS. 1A and 1B are photographs showing electron beam diffraction patterns of semiconductor thin films;

DETAILED DESCRIPTION OF THE PREFERRED EMBODIMENTS

Figure 2A:
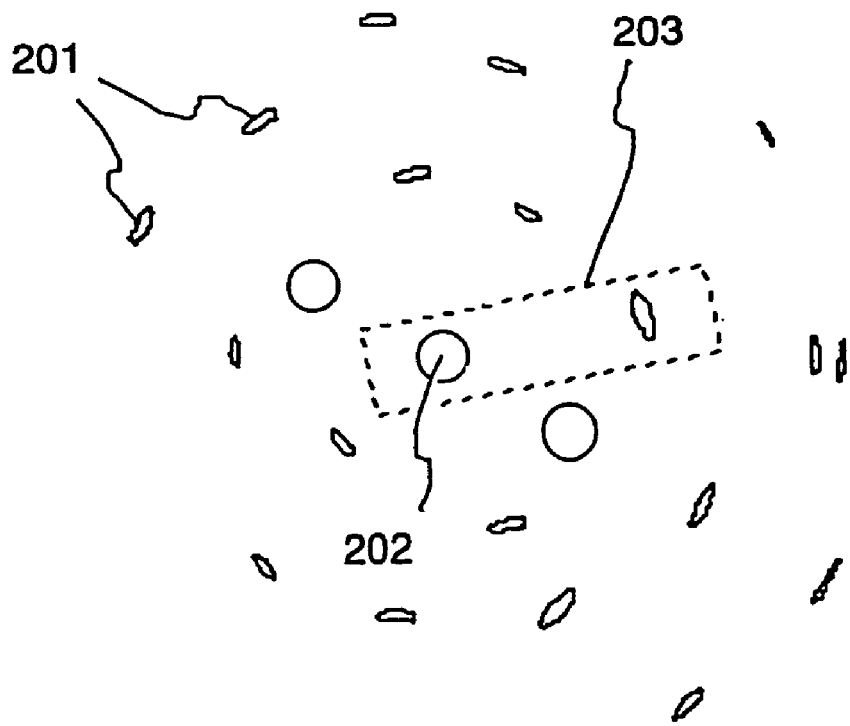
FIGS. 2A and 2B schematically show the electron beam diffraction pattern of FIG. 1A.

The present invention as summarized above will be hereinafter described in detail by using embodiments.

Embodiment 1

This embodiment is directed to a manufacturing process of a semiconductor thin film according to the invention and a semiconductor device (specifically, a TFT) using the semiconductor thin film as its active layer. The manufacturing process will be described basically with reference to FIGS. 5A-5E to 6A-6D.

First, a silicon substrate 501 as a substrate having an insulating surface is prepared. The silicon substrate 501 has been deoxidized by a hydrogen heat treatment. A thermal oxidation film 502 is then formed by performing thermal oxidation on the silicon substrate 501 in an atmosphere containing a halide gas (in this embodiment, a HCl gas).

The resulting thermal oxidation film 502 has a feature that it is much superior in flatness. In this embodiment, by optimizing the thermal oxidation conditions, a thermal oxidation film can be obtained in which the average of height differences between recesses and protrusions is 5 nm or less (typically 3 nm or less; preferably 2 nm or less) or, if 100 recess/protrusion pairs are examined, the recess/protrusion height difference is 10 nm or less for all of the 100 pairs and is 5 nm or less for 90 of those 100 pairs.

Figure 5A:
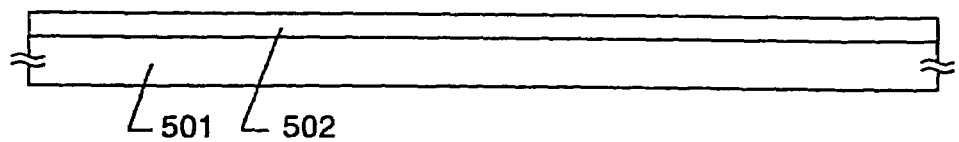
FIGS. 5A-5E and 6A-6D show a manufacturing process of a semiconductor device according to a first embodiment of the present invention.
Figure 5B:
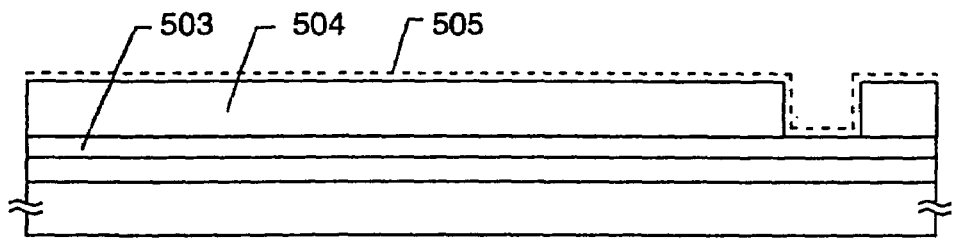

In this manner, a substrate having an extremely flat insulating surface is obtained as shown in FIG. 5A. The superior flatness plays an important role in forming a semiconductor thin film according to the invention.

Then, an amorphous silicon film 503 is formed at such a thickness that the final thickness (i.e., a thickness after thickness reduction due to thermal oxidation) will become 10-75 nm (preferably 15-45 nm). In this embodiment, the film formation is performed by low-pressure CVD under the following conditions:

Film forming temperature: 465° C.

Film forming pressure: 0.5 Torr

Film forming gases: He (helium) 300 sccm
    $Si_2H_6$ (disilane) 250 sccm

It is important that the concentrations of impurities in the film be thoroughly managed during the film formation. In this embodiment, the concentrations of C (carbon), N (nitrogen), and O (oxygen) that are impurities impairing the crystallization of the amorphous silicon film 503 when existing therein are managed as follows. The concentration of each of C and N is controlled so as to be less than $5\times10^{18}$ atoms/$cm^3$ (typically $5\times10^{17}$ atoms/$cm^3$ or less; preferably $2\times10^{17}$ atoms/$cm^3$ or less). The concentration of O is controlled so as to be less than $1.5\times10^{19}$ atoms/$cm^3$ (typically $1\times10^{18}$ atoms/$cm^3$ or less; preferably $5\times10^{17}$ atoms/$cm^3$ or less). This is because if any of these impurities exists at a concentration higher than the above value, it will adversely affect the crystallization that will be performed later, possibly lowering the film quality after the crystallization.

Figure 13:
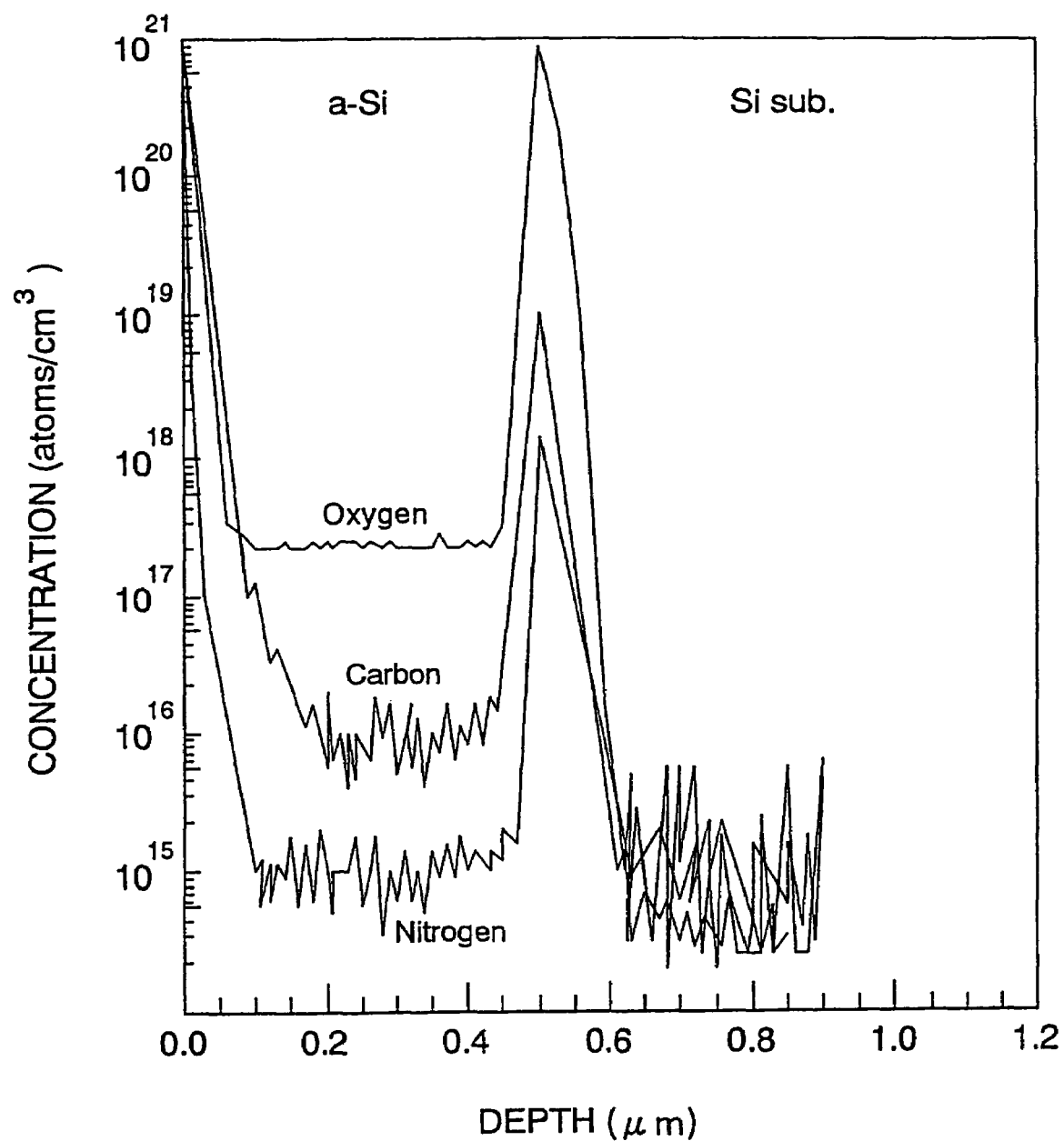
FIG. 13 is a graph showing a SIMS measurement result.

FIG. 13 shows a result of a SIMS (secondary ion mass spectroscopy) analysis in which the concentrations of impurities in an amorphous silicon film formed under the conditions of this embodiment were measured. The sample was such that a 0.5-μm-thick amorphous silicon film was formed on a silicon wafer. As seen from FIG. 13, it was confirmed that the concentrations of all of C, N, and O fell within the above ranges. It is noted that in this specification the concentration of an element in a film is defined by a minimum value in a SIMS measurement result.

To provide the above features, it is desirable that a low-pressure CVD furnace used in this embodiment be subjected to dry cleaning on a regular basis to keep its film forming chamber clean. The dry cleaning may be performed by causing a $ClF_3$ (chlorine fluoride) gas to flow at 100-300 sccm through the furnace that is heated to about 200°-400° C. and cleaning the film forming chamber by fluorine that is generated by thermal decomposition.

According to the knowledge of the inventors, deposits (mostly made of materials having silicon as the main component) of about 2 μm in thickness can be removed completely in 4 hours when the intrafurance temperature is set at 300° C. and the flow rate of a $ClF_3$ gas is set at 300 sccm.

The concentration of hydrogen in the amorphous silicon film 503 is also an important parameter; a film of better crystallinity appears to be obtained by making the hydrogen content smaller. Therefore, it is preferable that the amorphous silicon film 503 be formed by low-pressure CVD. It is possible to use plasma CVD by optimizing the film forming conditions.

Then, a step of crystallizing the amorphous silicon film 503 is executed by using the technique developed by the inventors that is disclosed in Japanese Laid-open Patent Publication No. Hei. 7-130652. Although either of techniques described in the first and second embodiments of this publication may be used, as far as this invention is concerned use of the technique of the second embodiment (described in detail in Japanese Laid-open Patent Publication No. Hei. 8-78329) is preferable. The disclosures of which are incorporated herein by reference.

According to the technique described in the publication No. Hei. 8-78329, first a mask insulating film 504 for selecting a catalyst element adding region is formed. Then, a Ni containing layer 505 is formed by applying, by spin coating, a solution containing nickel (Ni) as a catalyst element for accelerating crystallization of the amorphous silicon film 503 (see FIG. 5B).

Examples of usable catalyst elements other than nickel are cobalt (Co), iron (Fe), palladium (Pd), platinum (Pt), copper (Cu), gold (Au), germanium (Ge), lead (Pb), and indium (In).

The method of adding the catalyst element is not limited to spin coating, and ion implantation or plasma doping each of which uses a resist mask may also be employed. The latter case is effective in constructing more miniaturized circuits because the catalyst element adding region is small and the growth length of a lateral growth region can be controlled easily.

After the catalyst element adding step has finished, hydrogen removal is performed at 450° C. for 1 hour and then the amorphous silicon film 503 is crystallized by performing a heat treatment at 500°-700° C. (typically 550°-650° C.) for 4-24 hours in an inert gas, hydrogen, or oxygen atmosphere. In this embodiment, a heat treatment is performed at 570° C. for 14 hours in a nitrogen atmosphere.

Figure 5C:
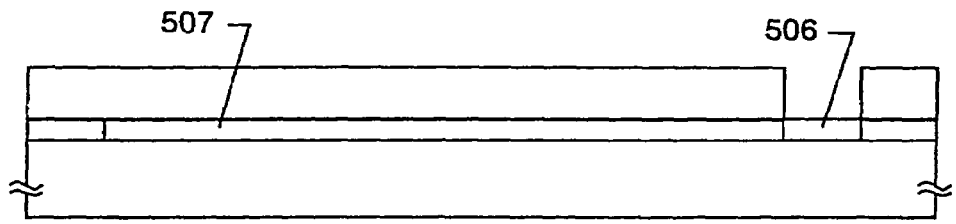

At this time, the crystallization of the amorphous silicon film 503 proceeds with priority from nuclei occurring in a nickel-added region 506 and a crystal region 507 is formed as a result of growth that is parallel with the surface of the substrate 501 (see FIG. 5C). The inventors call the crystal region 507 a lateral growth region. The lateral growth region is advantageous in having superior crystallinity as a whole because it is a collection of crystals having generally equal crystallinity.

After the heat treatment for crystallization has finished, the mask insulating film 504 is removed and then patterning is performed to form an island-like semiconductor layer (active layer) 508 all of which is constituted of part of the lateral growth region 507. Then, a gate insulating film 509 is formed that is an insulating film containing silicon. The thickness of the gate insulating film 509 may be adjusted in a range of 20-250 nm in terms of the thickness after being increased in a later thermal oxidation step. The film forming method may be a known vapor-phase method (plasma CVD, sputtering, or the like).

Figure 5D:
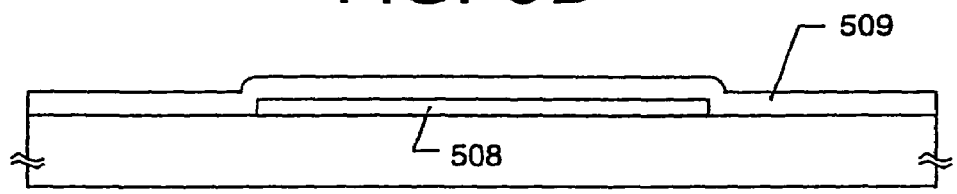

Then, as shown in FIG. 5D, a heat treatment (catalyst element gettering process) is performed to remove or reduce the concentration of the catalyst element (nickel). In this heat treatment, a halogen element is included in the processing atmosphere to utilize the metal element gettering effect of the halogen element.

To fully effectuate the gettering effect of the halogen element, it is preferable to perform the heat treatment at a temperature higher than 700° C. At 700° C. or less, there is a possibility that the halogen compound in the processing atmosphere are hardly decomposed and the gettering effect is not obtained. In view of this, the heat treatment temperature is preferably set at 800°-1,000° C. (typically 950° C.) and the processing time is set at 0.1-6 hours (typically 0.5-1 hour).

A typical example is such that a heat treatment is performed at 950° C. for 30 minutes in an atmosphere containing hydrogen chloride (HCl) at 0.5-10 vol % (in this embodiment, 3 vol %) with respect to oxygen. A HCl density higher than the above range is not preferable because asperities whose depth or height is equivalent to the thickness of the active layer 508 are formed.

Other than a HCl gas, one or plural kinds of compounds selected from compounds including a halogen element of HF, $NF_3$, HBr, $Cl_2$, $ClF_3$, $BCl_3$, $F_2$, $Br_2$, etc. may also be used.

In this step, nickel in the active layer 508 is gettered through the action of chlorine and removed into the air in the form of nickel chloride that is volatile. After the execution of this step, the concentration of nickel in the active layer 508 is decreased to $5 \times 10^{17}$ atoms/cm$^3$ or less (typically $2 \times 10^{17}$ atoms/cm$^3$ or less). According to the experience of the inventors, a nickel concentration of $1 \times 10^{18}$ atoms/cm$^3$ or less (preferably $5 \times 10^{17}$ atoms/cm$^3$ or less) does not cause any adverse effects on the TFT characteristics.

The above gettering treatment is also effective for metal elements other than nickel. Metal elements that may be mixed into the silicon film are mainly the constituent elements (typically aluminum, iron, chromium, etc.) of the film forming chamber. The above gettering treatment can reduce the concentrations of these metal elements to $5 \times 10^{17}$ atoms/cm$^3$ or less (preferably $2 \times 10^{17}$ atoms/cm$^3$ or less).

After the above gettering treatment, the halogen element that was used in the gettering treatment remains in the active layer 508 at a concentration of $1 \times 10^{15}$ to $1 \times 10^{20}$ atoms/cm$^3$.

In the above heat treatment, thermal oxidation reaction proceeds at the interface between the active layer 508 and the gate insulating film 509, whereby the thickness of the gate insulating film 509 increases as much as the thickness of a resulting thermal oxidation film. By forming a thermal oxidation film in this manner, a semiconductor/insulating film interface with a very small number of interface states can be obtained. The heat treatment also provides an effect that a failure in the thermal oxidation film formation at the ends of the active layer 508 (edge thinning) can be prevented.

It is also effective to improve the film quality of the gate insulating film 509 by performing a heat treatment at 950° C. for 1 hour in a nitrogen atmosphere after the above heat treatment in a halogen atmosphere.

It is to be noted that a halogen element gettering process may be performed between a crystallization step and a film formation step for a gate insulating film.

Figure 5E:
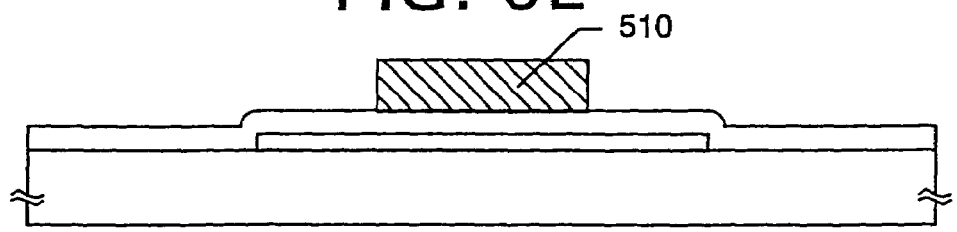

Thereafter, a metal film (not shown) having aluminum as the main component is formed and then patterned into a gate electrode starting member 510 (see FIG. 5E). In this embodiment, an aluminum film containing scandium at 2 wt % is formed. Other than such an aluminum film, a tantalum film, a conductive silicon film, etc. may also be used.

At this stage, a technique of the inventors that is disclosed in Japanese Laid-open Patent Publication No. Hei. 7-135318 is used. The disclosures of which are incorporated herein by reference. This publication discloses a technique of forming source and drain regions and low-concentration impurity regions in a self-aligned manner by using an oxide film formed by anodization. This technique will be described below briefly.

First, in a state that a resist film (not shown) that was used for patterning the aluminum film is left as it is, anodization is performed in a 3%-aqueous solution of oxalic acid, whereby a porous anodic oxide film 511 is formed. Since the thickness of the anodic oxide film 511 corresponds to the length of low-concentration impurity regions that will be formed later, the former is controlled so that the latter will have a desired value.

Then, after the resist film (not shown) is removed, anodization is performed in an electrolyte obtained by mixing tartaric acid (3%) into an ethylene glycol solution. As a result, a dense, non-porous anodic oxide film 512 is formed. Its thickness may be set at 70-120 nm.

Figure 6A:
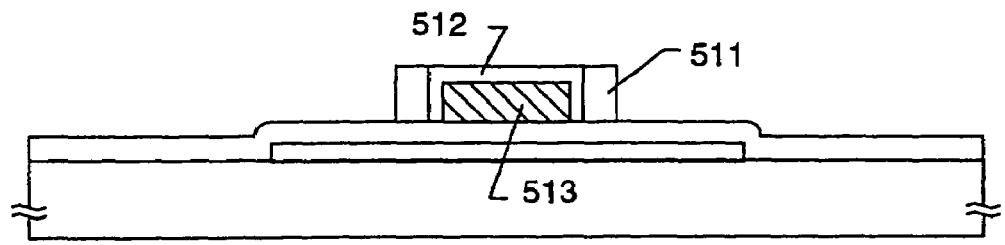
Figure 6B:
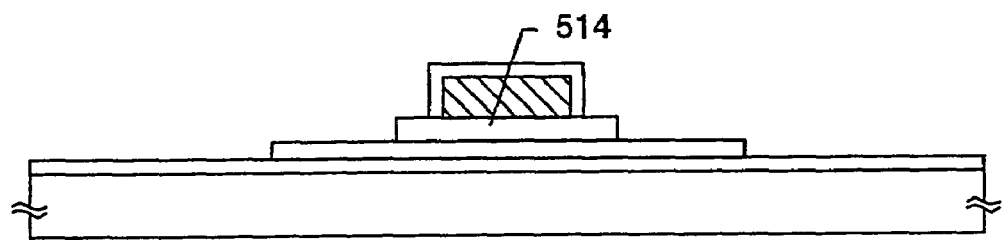
Figure 6C:
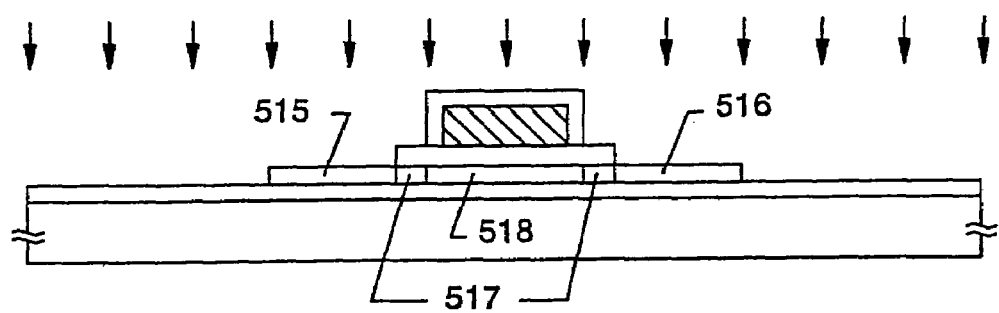

An aluminum film 513 that remains after the above two anodization steps will substantially serve as a gate electrode (see FIG. 6A).

Then, the gate insulating film 509 is etched by dry etching by using the gate electrode 513 and the porous anodic oxide film 511 as a mask. The porous anodic oxide film 511 is then removed. The end portions of a resulting gate insulating film 514 project by the thickness of the porous anodic oxide film 511 (see FIG. 6B).

Then, a step of adding an impurity element for imparting one conductivity type is performed. The impurity element may be P (phosphorus) or As (arsenic) for n-type conductivity and B (boron) or In (indium) for p-type conductivity.

In this step, first impurity addition is performed at a high acceleration voltage to form n⁻ regions. Because the acceleration voltage is as high as about 80 kV, the impurity element is added to not only the exposed portions of the active layer 508 but also the portions of the active layer 508 located under the exposed end portions of the gate insulating film 514. Second impurity addition is then performed at a low acceleration voltage to form n⁺ regions. Because the acceleration voltage is as low as 10 kV, the gate insulating film 514 serves as a mask.

Among the impurity regions formed by the above step, the n+regions become a source region 515 and a drain region 516 and the n-regions become a pair of low-concentration impurity regions (one of which is called a LDD region) 517. The impurity element is not added to the portion of the active layer 508 right under the gate electrode 513, which becomes an intrinsic or substantially intrinsic channel forming region 518 (see FIG. 6C).

After the active layer has been completed in the above manner, the impurity element is activated by a combination of furnace annealing, laser annealing, lamp annealing, etc. At the same time, damage of the active layer caused in the impurity element adding step is repaired.

Then, a 500-nm-thick interlayer insulating film 519 is formed, which may be a silicon oxide film, a silicon nitride film, a silicon oxynitride film, an organic resin film, or a multilayered film thereof.

Figure 6D:
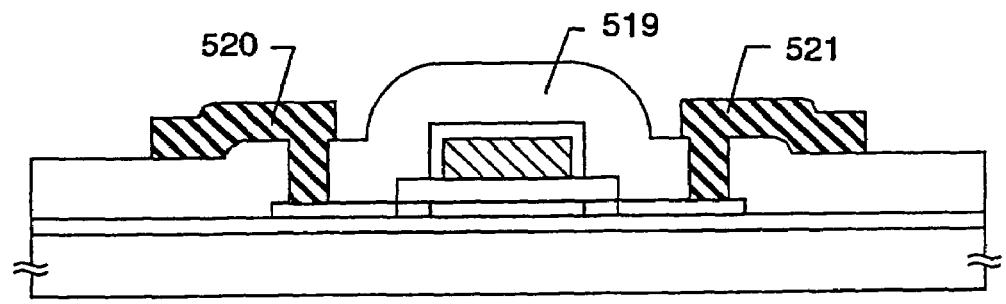

Then, after contact holes are formed, a source electrode 520 and a drain electrode 521 are formed. Finally, the entire device is hydrogenated by heating the entire substrate at 350° C. for 1-2 hours, whereby dangling bonds in the films (particularly in the active layer) are terminated. A TFT having a structure shown in FIG. 6D is thus manufactured.

Since the invention is directed to the technique relating to a semiconductor thin film that constitutes an active layer, the other structures and configurations do not restrict the invention at all. Therefore, the invention can easily be applied to TFTs having different structures and configurations than in this embodiment.

Knowledge Relating to Impurities Contained in Active Layer

An active layer (semiconductor thin film) of this embodiment has a feature that it contains no or substantially no C (carbon), N (nitrogen), and O (oxygen), which are elements impairing the crystallization of the active layer. This feature is obtained by thorough management of impurities (pollutants).

In this embodiment, the mixing of C, N, and O is thoroughly avoided in forming an amorphous silicon film, necessarily resulting in the feature that the concentration of each of C and N in a final semiconductor film is at most less than $5 \times 10^{18}$ atoms/cm³ (typically $5 \times 10^{17}$ atoms/cm³ or less; preferably $2 \times 10^{17}$ atoms/cm³ or less) and the concentration of O is at most less than $1.5 \times 10^{19}$ atoms/cm³ (typically $1 \times 10^{18}$ atoms/cm³ or less; preferably $5 \times 10^{17}$ atoms/cm³ or less).

A pure semiconductor film that is made of only silicon has a silicon concentration of about $5 \times 10^{22}$ atoms/cm³. Therefore, for example, an impurity element concentration of $5 \times 10^{18}$ atoms/cm³ corresponds to about 0.01 atomic %.

To obtain superior crystallinity, it is desirable that the concentrations of C, N, and O in the final semiconductor film be less than the detection limit of a SIMS analysis and it is more desirable that the final semiconductor film contain no such impurities at all.

SIMS analyses of the inventors revealed that if an amorphous silicon film in which the concentrations of C, N, and O fall within the above ranges is used as a starting film, the concentrations of C, N, and O contained in the active layer of a completed TFT also fall within the above ranges.

Knowledge Relating to Crystal Structure of Active Layer

Microscopically, an active layer formed by the above manufacturing process has a crystal structure in which a plurality of rod-like (or flat-rod-like) crystals are arranged approximately parallel with each other with such regularity that they are directed to a particular direction. This can easily be confirmed by an observation by a TEM (transmission electron microscope) method.

Figure 17A:
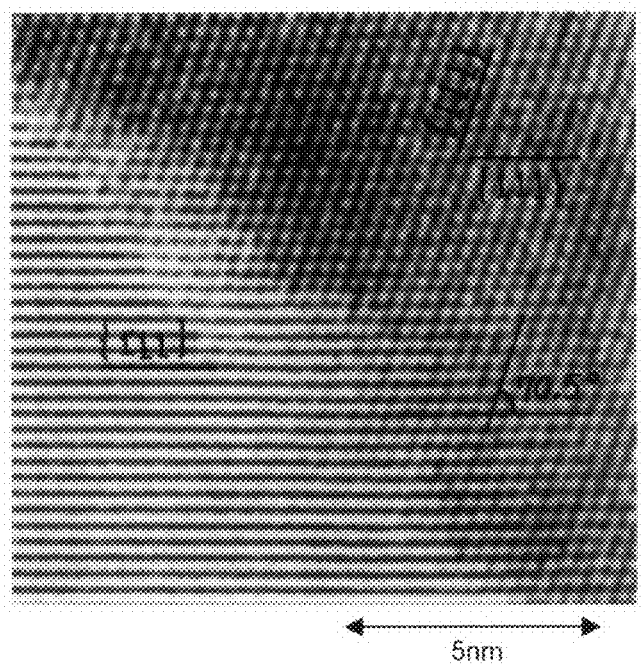
FIGS. 17A and 17B are TEM photographs showing crystal grains of semiconductor thin film.
Figure 17B:
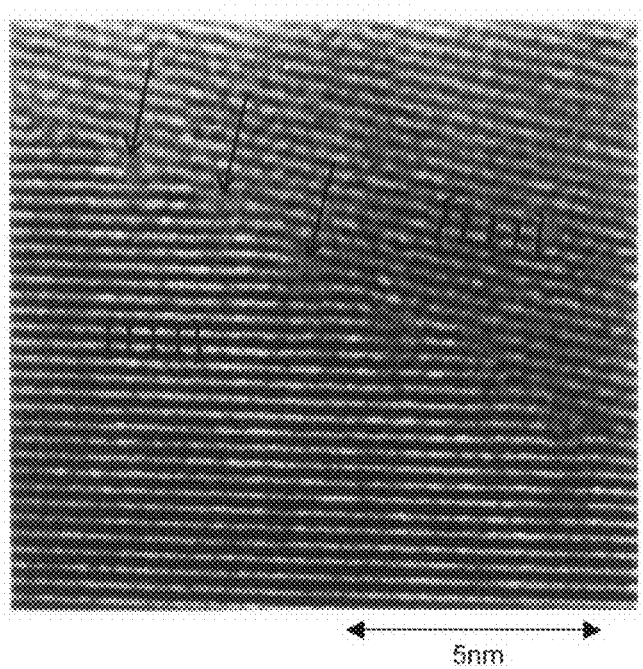

FIGS. 17A and 17B are HR-TEM photographs with 8 million times of magnification of the grain boundaries comprising rod-like or flat-rod-like crystals. In this specification, the grain boundary is defined, unless otherwise specified, as one that is formed at the interface where the rod-like crystals or the flat-rod-like crystals are contacted with each other. Accordingly, it is distinguished from a macroscopic grain boundary that is formed by, for instance, collision of lateral growth regions.

The above-mentioned HR-TEM (high-resolution transmission electron microscope) method is a technique in which an electron beam is vertically applied to a sample and an arrangement of atoms or molecules is evaluated by utilizing interference among transmitted electrons or elastically scattered electrons.

By using HR-TEM, an arrangement state of crystal lattices can be observed as a lattice fringe. Therefore, by observing grain boundaries, a bonding state of atoms at grain boundaries can be estimated. Incidentally, the lattice fringe appears as a fringe consisting of white and black. However, it occurs due to a difference of contrast, and does not indicate the positions of atoms.

FIG. 17A is a typical TEM photograph of a crystalline silicon film that is obtained according to the present invention. A state that two different crystal grains contact each other at the grain boundaries shown from the upper left to the right lower was observed. In this case, the two crystal grains approximately had {110} orientation though there was a small shift between their crystal axes.

It is confirmed by x-ray diffraction or electron beam diffraction that, as a result of checking a plurality of crystal grains, the crystal grains approximately had {110} orientation in most of cases, which will be described later. Incidentally, among the results of the observations in many cases, a (011) plane or a (200) plane may be found, however, those having an equivalent value is expressed totally as a {111} plane.

As shown in FIG. 17A, a lattice fringe corresponding to a {111} plane or a {100} plane was found in a lattice fringe of the {110} plane. The "lattice fringe corresponding to the {111} plane" means a such lattice fringe that a {111} plane appears as a cross-section obtained by cutting a crystal grain along the lattice fringe. What plane a lattice fringe corresponds to can be checked with simply based on intervals of the lattice fringes.

In FIG. 17A, there is a difference in the visible states of the lattice fringes, however, which causes a delicate difference in inclinations of the crystal grains. That is, when it is set so that electron beam is vertically irradiated onto one crystal plane of the crystal grains, since the other crystal grains become a state that the electron beam is actually irradiated with an inclination thereonto, the views of the lattice fringes are changed.

Here, attention is paid on the lattice fringe corresponding to the {111} plane. In FIG. 17A, the lattice fringe of the crystal grains corresponding to the {111} plane, located upper side while acrossing the grain boundaries, intersects the lattice fringe of the crystal grains corresponding to the {111} plane, located lower side, at about 70° (more correctly 70.5°).

This indicates a crystal structure (more correctly, a grain boundary structure) that two different crystal grains are connected to each other at the grain boundaries with an extremely high degree of matching. That is, crystal lattices are continuously connected to each other at grain boundaries and trap states due to crystal defects etc. are far less prone to occur. In other words, crystal lattices have continuity at grain boundaries.

For the reference, an HR-TEM photograph of conventional high-temperature polysilicon film is shown in FIG. 17B. In case of FIG. 17B, crystal plane has no regularity, to be described later, the {110} plane does not constitute main orientation. However, in FIG. 17B, in order to compare with FIG. 17A, crystal grains in which the lattice fringe corresponding to the {111} plane appears were observed.

Observing FIG. 17B in detail, as shown in the figure by an arrow, it was found many portion where the lattice fringes are disconnected at the grain boundaries. In such portions, dangling bond (called crystal defect) exists, and there is a risk that such defect inhibits movement of carriers as a trap level.

Actually, dangling bond as shown in FIG. 17B exists in the crystalline silicon film according to the present invention. This result is not avoidable as long as a crystalline silicon film according to the present invention is a polycrystal. However, as a result of observing the crystalline silicon film of the present invention extendedly in detail by TEM, it was found that extremely few dangling bonds existed therein.

As long as the present inventors carried out observation, it was found that crystal lattices were continuous in 90% or more (typically 95% or more), as a whole, of grain boundaries, and few dangling bonds as shown in FIG. 17B were observed. From this result, it can also say that the crystalline silicon film according to the present invention clearly differs from the conventional high temperature polysilicon.

Then, FIG. 1A shows a result of an electron beam diffraction analysis on a semiconductor thin film according to the invention. FIG. 1B shows an electron beam diffraction pattern of a conventional polysilicon film as a reference. In FIGS. 1A and 1B, the diameters of electron beam application areas are 4.25 µm and 1.35 µm respectively. These photographs are typical ones selected from photographs taken at a plurality of locations.

In the case of FIG. 1A, diffraction spots corresponding to <110> incidence appear relatively clearly and it is confirmed that almost all crystal grains in the electron beam application area have {110} orientation.

Incidentally, the present inventors carried out x-ray diffraction in accordance with a technique disclosed in Japanese Laid-open Patent Publication No. Hei. 7-321339, and an orientation ratio of the semiconductor thin film according to the present invention was calculated. The disclosure of which is incorporated herein by reference. In the patent publication, the orientation ratio was calculated in accordance with the calculation method as shown in Equation 1.

{220} orientation abundance=1 (fixed)

{111} orientation abundance=relative strength of sample {111} to {220}/relative strength of powder {111} to {220}

{311} orientation abundance=relative strength of sample {311} to {220}/relative strength of powder {311} to {220}

{220} orientation ratio={220} orientation abundance/{220} orientation abundance+{111} orientation abundance+{311} orientation abundance   [Equation 1]

As a result of checking by x-ray diffraction an orientation of semiconductor thin film according to the present invention, a peak corresponding to a (220) plane was appeared in an x-ray diffraction pattern. It is needless to say that the (220) plane has an equivalent value to the {110} plane. As a result, it was confirmed that the {110} plane was a main orientation plane, and the orientation ratio was 0.7 or more (typically 0.9 or more).

On the other hand, in the case of the conventional high-temperature polysilicon film shown in FIG. 1B, diffraction spots do not have clear regularity and are oriented approximately randomly; in other words, it is confirmed that crystal grains having various kinds of plane orientation other than the {110} orientation are mixed in an irregular manner.

Incidentally, each diffraction spot has slight spreads on concentric circles, which is, however, considered due to a certain distribution in the rotation angle around the crystal axis. This will be described below.

FIG. 2A schematically shows part of the electron beam diffraction pattern of FIG. 1A. In FIG. 2A, a plurality of bright spots 201, which are diffraction spots corresponding to the <110> incidence, are distributed in a concentric manner with a central point 202 of the irradiation area as the center.

Figure 2B:
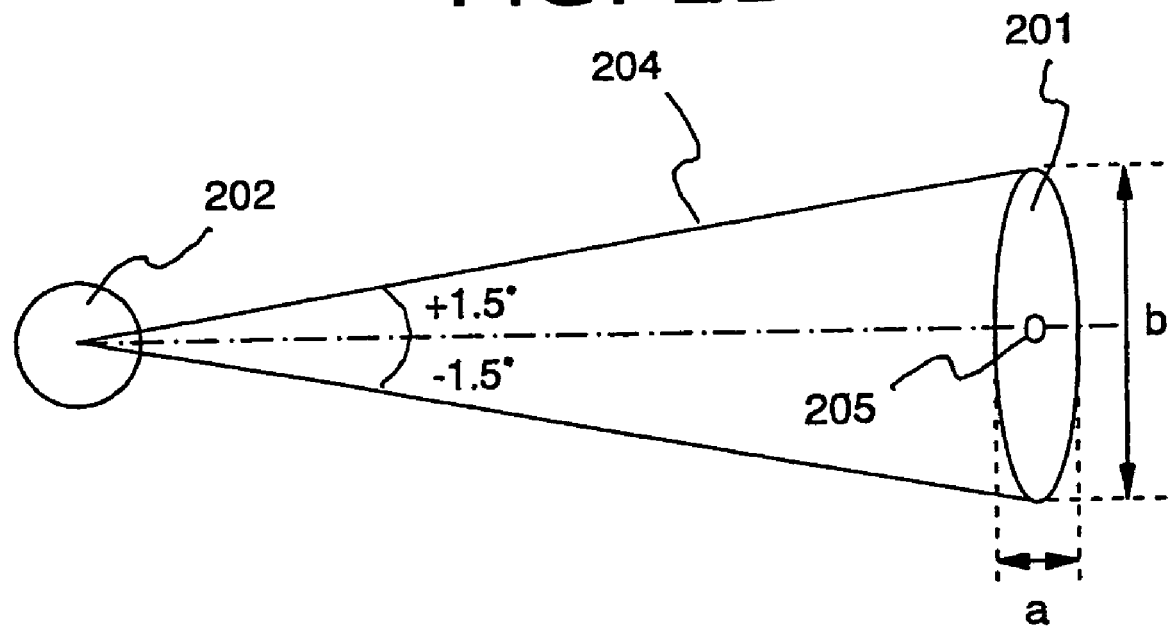

FIG. 2B is an enlarged version of a region 203 surrounded by a broken line in FIG. 2A. As shown in FIG. 2B, a detailed examination of the electron beam diffraction pattern of FIG. 1A shows that a diffraction spot 201 has a spread (fluctuation) of about ±1.5° with respect to the central point 202 of the irradiation area.

That is, the angle formed by a tangential line 204 to the diffraction spot 201 from the central point 202 of the electron beam irradiation area and a line segment connecting the central point 202 of the electron beam irradiation area and a central point 205 of the diffraction spot (this angle corresponds to ½ of the rotation angle) is 1.5° or less. Since two tangential lines can be drawn, the spread of the diffraction spot 201 is in the range of ±1.5°.

This tendency is found in the entire area of the electron beam diffraction pattern of FIG. 1A and the spreads of the diffraction spots fall within ±2.5° (typically within ±1.5°; preferably within 0.5°). The above-mentioned sentence "each diffraction spot has slight spreads on concentric circles" means this tendency.

The ratio (a/b) of the length (a) of the minor axis of the diffraction spot 201 to its major-axis length (b) can be made equal to 1/1 (circle) to 1/1.5 by making the underlying surface of a semiconductor thin film as close to a complete flat surface as possible. This means that diffraction spots become circular or substantially circular.

To make diffraction spots circular, the rotation angle among a plurality of crystal grains should be made very small. Diffraction spots of an electron beam diffraction pattern of a single crystal are completely circular. Therefore, making diffraction spots circular means making a semiconductor thin film of the invention as close to a single crystal as possible.

Figure 3A:
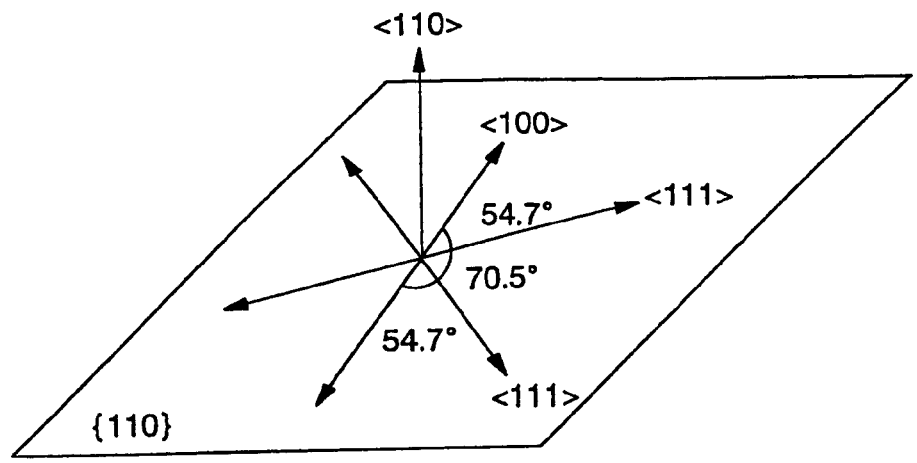
FIGS. 3A-3C illustrate a directional relationship of a semiconductor thin film.

FIG. 3A shows a relationship between the crystal axis and axes included in a crystal surface in a case where the plane orientation is {110}. As shown in FIG. 3A, in the case of a crystal surface having {110} orientation, the crystal axis is the <110> axis and the <111> axis, the <100> axis, etc. exist in the crystal surface.

The inventors previously studied the growth direction of rod-like crystals of the above-mentioned kind by the HR-TEM method, and it was confirmed that they grew approximately along the <111> axis (refer to Japanese Laid-open Patent Publication No. Hei. 7-321339). The disclosures of which are incorporated herein by reference. Therefore, it is considered that part of a semiconductor thin film of the invention is as shown in an enlarged view of FIG. 3B.

Figure 3B:
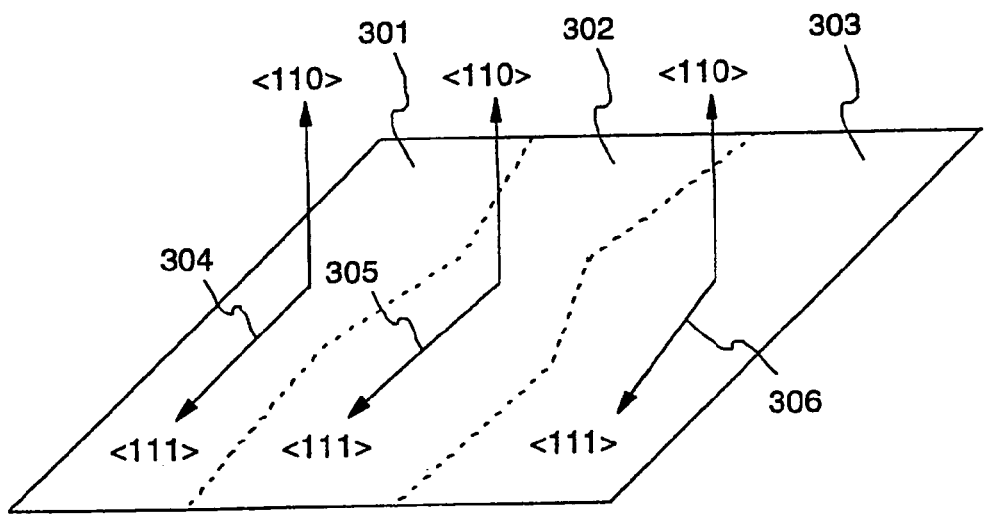

In FIG. 3B, reference numerals 301-303 denote different rod-like crystals and the crystal axes of the respective crystal grains approximately coincide with the <110> axis. Since on average the crystal growth proceeds approximately along the <111> axis, the rod-like crystals extending directions approximately coincide with the <111> axis directions. Broken lines indicate grain boundaries.

In this case, if a <111> axis 304 included in the surface of an arbitrary crystal grain 301 is employed as a reference axis, <111> axes 305 and 306 included in the surfaces of other nearby rod-like crystals 302 and 303 coincide with the reference axis 304 or slightly deviate from the reference axis 304 and form certain angles with it, respectively. In this specification, this angle is called the "rotation angle."

The above-mentioned fact that the spreads of respective diffraction spots fall within ±2.5° (typically within ±1.5°; preferably within ±0.5°) has the same meaning as that the absolute values of respective rotation angles are within 5° (typically within 3°; preferably within 1°).

Figure 3C:
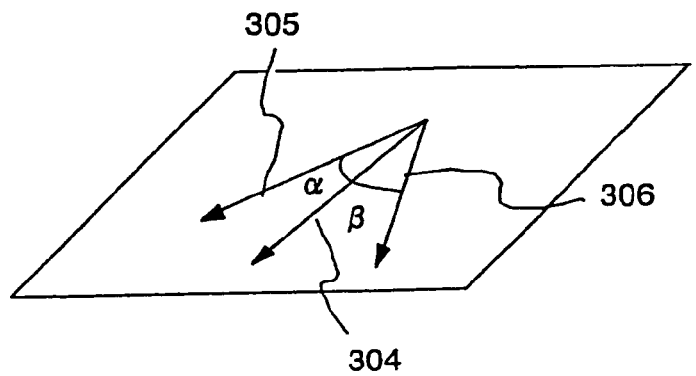

FIG. 3C summarizes the above relationship. In a semiconductor thin film of the invention, an angle ($\alpha$) formed by the axis 305 and the reference axis 304, and an angle ($\beta$) formed by the axis 306 and the reference axis 304 are rotation angles and they are at most within 5°.

Crystal grains having slightly different rotation angles as shown in FIG. 3B appear as different diffraction Spots in an electron beam diffraction pattern. For example, diffraction spots of the crystal grains 302 and 303 deviate from a diffraction spot of the crystal grain 301 by the rotation angles $\alpha$ and $\beta$, respectively, on a concentric circle.

That is, if a plurality of crystal grains exist in a electron beam irradiation area, diffraction spots corresponding to those plurality of crystal grains are arranged continuously on a concentric circle, whereby a resulting diffraction spot has an apparent shape that is close to an ellipse. This is the reason why each diffraction spot of the electron beam diffraction pattern of FIG. 1A has a spread.

The notation of, for instance, <111> used in this specification includes equivalent axes [111], [1-11], etc. (the minus sign means inversion). Diffraction spots appear for all of the equivalent axes so as to form an electron beam diffraction pattern as shown in FIG. 1A. If crystal grains are rotated by a certain rotation angle, an electron beam diffraction pattern is also rotated as a whole by the rotation angle. Therefore, all diffraction spots have a spread on a concentric circle.

It is concluded that the reason why a diffraction pattern as shown in FIG. 1A was obtained when a semiconductor thin film of the invention was examined by electron beam diffraction is that a plurality of rod-like crystals existed in the electron beam irradiation area and had slightly different rotation angles. Based on the spreads of respective diffraction spots, the absolute values of rotation angles are estimated to be within 5° (typically within 3°; preferably within 1°).

This means that a deviation between arbitrary reference axes of two crystal grains having the largest rotation angles among all crystal grains constituting a semiconductor thin film of the invention is within 5°.

Now, a description will be made of the degree of existence of various kinds of crystal grains in a semiconductor thin film of the invention according to the common grain boundary classification. Table 1 has been obtained based on data of semiconductor thin films of the invention.

TABLE 1

| Kinds of grain boundaries | | Features | Semiconductor thin film of invention | Remarks |
| --- | --- | --- | --- | --- |
| Small-angle boundary (rotational relationship of less than approx. 15°) | Small inclination angle boundary | Slightly rotated about direction included in boundary surface | None or substantially non-existent | If these kinds of boundaries do not exist or exist at a very small percentage, the crystal can be regarded (substantially) as a single |
| | (Small) twisted boundary | Slightly rotated | | |

TABLE 1-continued

| Kinds of grain boundaries | | Features | Semiconductor thin film of invention | Remarks |
|---|---|---|---|---|
| Special large-angle boundary | Twin boundary | about direction perpendicular to boundary surface. Rotated by 180° about certain common direction. | Small percentage (Hard to eliminate it completely because it is highly stable in terms of energy among various defects.) | crystal. |
| | Other correspondence boundaries | Lattice points common to grains on both sides of boundary exist at certain percentage. | None or substantially non-existent | |
| Random large-angle boundary | | No meaningful directional relationship. | None or substantially non-existent | If boundaries of this kind exist, the crystal cannot be regarded even as a quasi-single crystal. |

The several kinds of grain boundaries shown in Table 1 can be discriminated from each other by making good use of electron beam diffraction, an HR-TEM method, a cross-sectional TEM method, etc., and even more detailed information can be obtained. Values of the rotation angle appearing in this specification are ones measured by analyzing grain boundaries from various aspects by combining the above techniques.

Figure 4A:
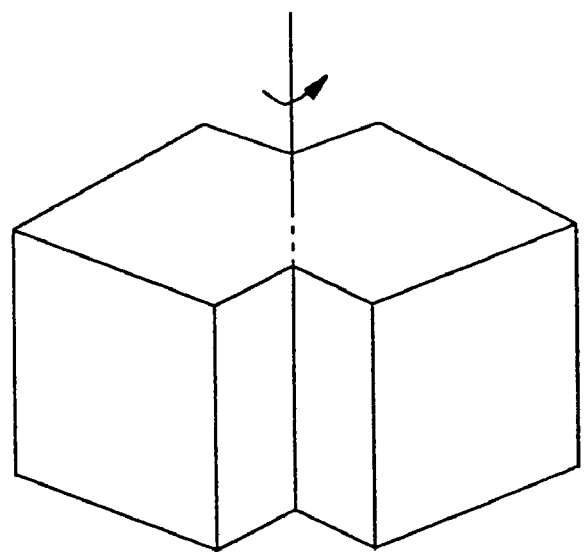
FIGS. 4A-4C illustrate forms of grain boundaries.

Grain boundaries of the above-mentioned rotation about a crystal axis are classified as the small inclination angle boundary because it is a "rotation about a direction included in the boundary surface." In forming this type of grain boundary, two crystal grains contact each other in a relationship schematically shown in FIG. 4A. In this case, the surface where the two crystal grains contact each other is a boundary surface. However, in a semiconductor thin film of the invention, it is possible to consider that grain boundaries of the kind shown in FIG. 4A do not exist because the rotation angle about the crystal axis is as extremely small as within ±2.5°.

Figure 4B:
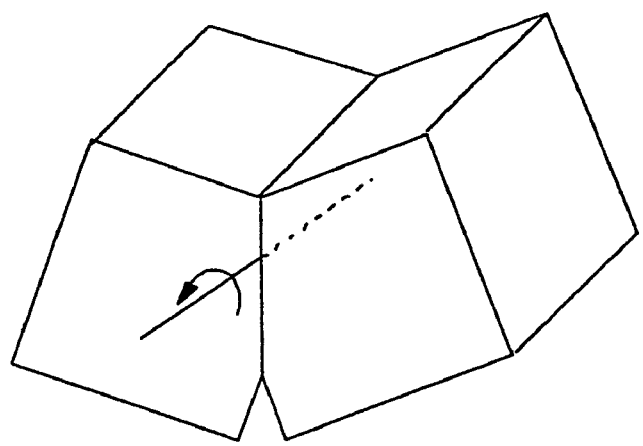

The small inclination angle boundary includes a version shown in FIG. 4B. In this case, the rotation axis is different than in FIG. 4A. However, the grain boundary of FIG. 4B is the same as that of FIG. 4A in that two crystal grains form a certain rotation angle about an axis included in the boundary surface. In a semiconductor thin film of the invention, it is also possible to consider that grain boundaries of this kind do not exist because the rotation angle is within ±2.5° (typically within ±1.5°; preferably within ±0.5°).

Figure 4C:
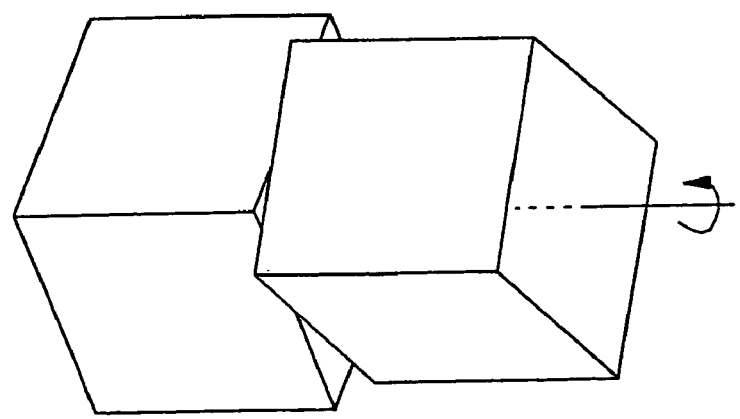

The small-angle boundary also includes a form called the twisted boundary which is distinguished from the small inclination angle boundary shown in FIGS. 4A and 4B. As shown in FIG. 4C, the twisted boundary corresponds to a case where the rotation is about an axis that is perpendicular to the boundary surface.

The twisted boundary is the same as the small inclination angle boundary in that two crystal grains form a certain rotation angle. In a semiconductor thin film of the invention, the rotation angle is within ±2.5° (typically within ±1.5°; preferably within ±0.5°). That is, it is possible to consider that there are almost no twisted boundaries.

As described above, it is possible to consider that a semiconductor thin film of the invention has no or substantially no electrically active grain boundaries commonly called the; small-angle boundary. It is to be noted that the term "electrically active" means that a carrier can function as a trap.

Also, the term "substantially no" means that at most one or two grain boundaries of the kind concerned (for instance, the small-angle boundary) are found when grain boundaries in an area of, for instance, 5 µm$^2$ are examined.

The special large-angle boundary includes the twin boundary and the other correspondence boundaries. However, it is confirmed that almost of the semiconductor thin films of the invention are twin boundaries. Also, it was confirmed that even if the correspondence boundaries exist, they are electrically inactive (not function as traps).

In the semiconductor thin film of the invention, in special, the correspondence boundaries ({111} twin boundaries) of 3 make up 90% (typically 95% or more) of entire grain boundaries, and therefore it is extensively proved that the grain boundaries with high degree of matching are formed therein.

The value of $\Sigma$ is a parameter as a guideline for indicating the degree of matching of the correspondence boundaries, and it is known that as the value of $\Sigma$ becomes lower, the higher the degree of matching of the grain boundaries becomes. As to the definition of $\Sigma$ value, it is described in detail in "High resolving power electron microscopy for evaluating material," written jointly by Daisuke Shindo and Kenji Hiraga, pp. 54-60, Kyoritsu Shuppan K. K 1996. The disclosure of which is incorporated herein by reference.

In the grain boundaries formed between two crystal grains, in the case where the plane orientations of both crystals are {110}, if an angle formed by lattice fringes corresponding to a {111} plane is defined as θ, it is known that the grain boundaries become the correspondence boundaries of $\Sigma 3$ when θ=70.5°.

Therefore, in the grain boundaries shown in a TEM photograph of FIG. 1A, each lattice fringe of adjacent crystal grains is continuous with an angle of 70.5°, thereby being capable of easily inferring that the grain boundaries are twin boundaries of {111}.

It is to be noted that when θ=38.9°, the grain boundaries become the correspondence boundaries of $\Sigma 9$. However, such other correspondence boundaries slightly existed therein.

The above-mentioned correspondence boundaries are formed only between grain boundaries oriented in the same direction.

That is, the plane orientation of the semiconductor thin film of the invention substantially aligned with {110}. As a result, it is possible to form the correspondence boundaries covering a wide area. This feature does not appear in other polysilicon film with an irregular plane orientation.

Further, the random large-angle boundary is a grain boundary that is found in a semiconductor film in which crystal grains are arranged in irregular directions, that is, without any meaningful directional relationship. Such a conventional semiconductor thin film as a high-temperature polysilicon film has many grain boundaries of this kind. Naturally, a semiconductor thin film of the invention has almost no random large-angle boundaries.

If neither the small-angle boundary nor the special random large-angle boundary (see Table 1) exists or they exist in an extremely small number, it is possible to consider that no grain boundaries exist. That is, a semiconductor thin film having such a crystal structure can be considered a single crystal or so considered substantially, having no substantial grain boundaries.

In a semiconductor thin film of the invention, the main orientation plane is the {110} plane over the entire film because each crystal grain is approximately {110}-oriented. Although individual crystal grains form certain rotation angles with each other, the rotation angles are within ±2.5° (typically within ±1.5°; preferably within ±0.5°). Therefore, it can be considered that substantially no grain boundaries exist. The above discussions lead to a conclusion that a semiconductor thin film of the invention can be considered a single crystal or so considered substantially.

As described above, in a semiconductor thin film of the invention, individual crystal grains constituting the thin film are oriented in the same direction or in a relationship having a certain rotation angle. The rotation angles are as very small as within ±2.5°, which is at such a level as to be regarded as not forming grain boundaries substantially.

The inventors attach importance to the flatness of the underlying surface as a reason why such a semiconductor thin is obtained. According to the experiences of the inventors, irregularities on the underlying surface greatly affect the crystal growth. That is, irregularities etc. on the underlying surface cause strains or the like in crystal grains, to cause deviations or the like of the crystal axis.

A semiconductor thin film of the invention is formed on an undercoat film very high in flatness that is formed by the method as described in this embodiment. Since crystal growth proceeds in a state that the factors impairing the crystal growth are eliminated as much as possible, crystal grains join each other while very high crystallinity is maintained. It is considered that a semiconductor thin film having such crystallinity as can substantially be regarded as a single crystal is obtained as a result of the above crystal growth.

In forming a semiconductor thin film of the invention, the annealing step (in this embodiment, the step of FIG. 5D) that is performed at a temperature higher than the crystallization temperature plays an important role in decreasing defects in crystal grains. This will be explained below.

Figure 14A:
FIGS. 14A and 14B are TEM photographs showing crystal grains of crystal silicon films.

FIG. 14A is a TEM photograph with 250 thousand times of magnification of a crystal silicon film at the time point when the crystallization step of FIG. 5C has finished. A zigzagged defect (indicated by an arrow) is found in crystal grains (black and white portions appear due to a difference in contrast).

Although the defect of this type is mainly a stacking fault caused by erroneous stacking order of atoms in silicon lattice planes, it may be a dislocation or some other defect. The defect of FIG. 14A appears to be a stacking fault having a defect surface parallel with the {111} plane, as judged from the fact that the zigzagged defect is bent at about 70°.

Figure 14B:
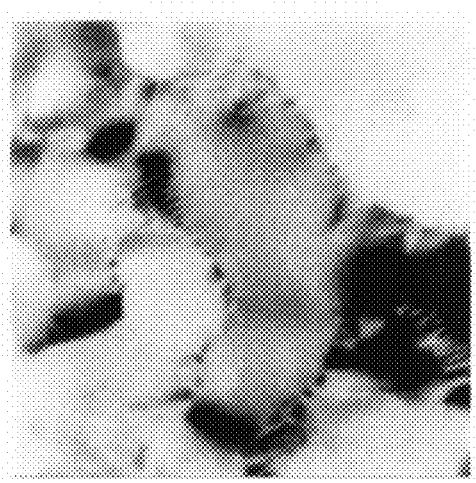

On the other hand, as shown in FIG. 14B, a crystal silicon film of the invention that is viewed with the same magnification has almost no defects of stacking faults, dislocations, etc. in crystal grains and hence has very high crystallinity. This tendency holds over the entire film surface. Although it is currently difficult to make the number of defects zero, it is possible to decrease it to such a level as can substantially be regarded as zero.

That is, the crystal silicon film of FIG. 14B can be considered a single crystal or so considered substantially because the number of defects in crystal grains is reduced to an almost negligible level and grain boundaries never become barriers for carrier movement by virtue of their high continuity.

As described above, although the crystal silicon films shown in the photographs of FIGS. 14A and 14B are approximately the same in continuity, they are much different in the number of defects in crystal grains. The fact that the crystal silicon film of this embodiment exhibits far superior electrical characteristics to the crystal silicon film of FIG. 14A is largely due to the difference in the number of defects.

The present assignee assumes the following model for phenomena occurring in the step of FIG. 5D. First, in the state of FIG. 14A, atoms of the catalyst element (typically nickel) are segregated in defects (mainly stacking faults) in crystal grains. That is, it is considered that there exist many Si—Ni—Si type bonds.

When the catalyst element gettering process is executed, Ni atoms existing in defects are removed and Si—Ni bonds are disconnected. Excess bonds of Si atoms immediately form Si—Si bonds to establish a stable state. The defects disappear in this manner.

It is known that defects in a crystal silicon film disappear when high-temperature annealing is performed. It is inferred that in the invention the silicon recombination occurs more smoothly because many dangling bonds are generated by disconnection of Si—Ni bonds.

Further, it is considered that excess silicon atoms that are generated at the same time when the crystal silicon film is thermally oxidized move to defects and greatly contribute to formation of Si—Si bonds. This is the same notion as explains why a high-temperature polysilicon film has only a small number of defects in crystal grains.

The present assignee also assumes a model that the heat treatment at a temperature (typically 700°-1,100° C.) higher than the crystallization temperature causes the crystal silicon film to be fixed to the underlying surface to improve the adhesion there, which in turn causes defects to disappear.

The crystal silicon film and the silicon oxide film as the undercoat film are different from each other in thermal expansion coefficient by a factor close to 10. Therefore, after the amorphous silicon film has been converted into the crystal silicon film (see FIG. 14A), very strong stress is imposed on the crystal silicon film during its cooling.

Figure 15A:
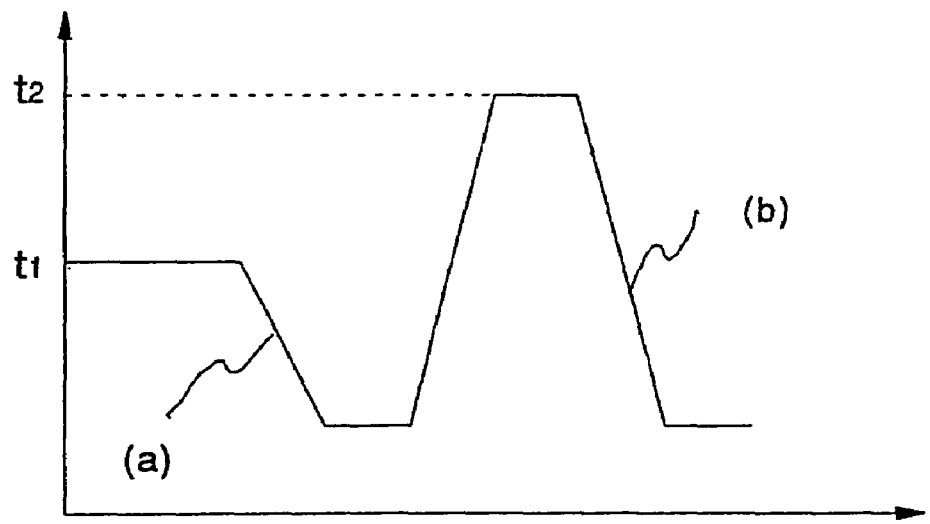
FIGS. 15A-15C illustrate a model for generation and extinction of defects.

This will be explained below with reference to FIGS. 15A-15C. FIG. 15A shows a heat history to which a crystal silicon film is subjected after the crystallization step. First, a crystal silicon film that has been crystallized at temperature $t_1$ is cooled to the room temperature in a cooling period (a).

Figure 15B:
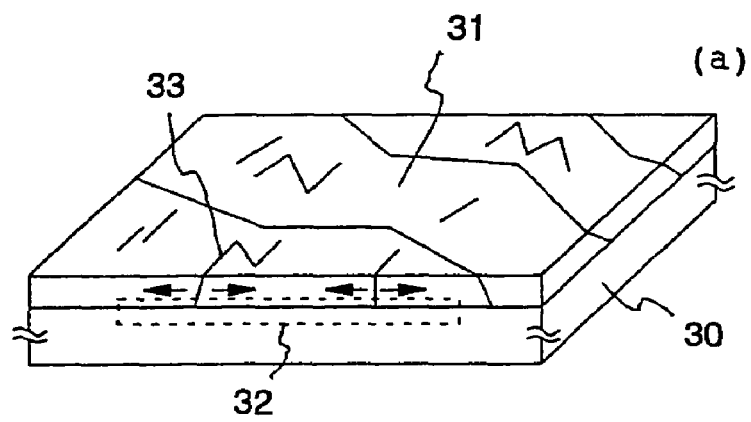
Figure 15C:
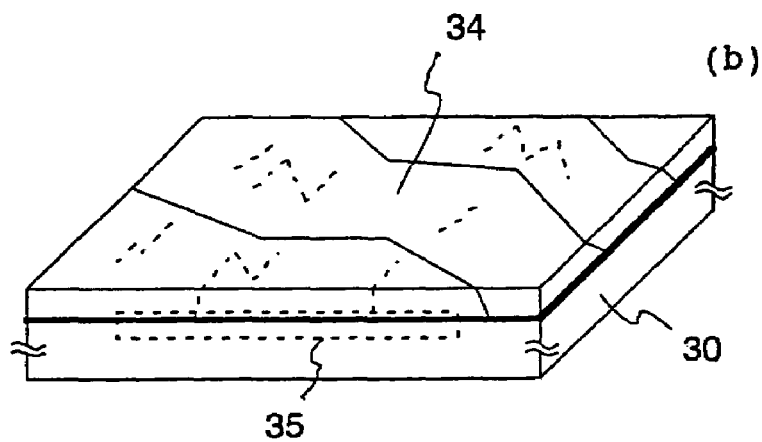

FIG. 15B shows the crystal silicon film that is in the midst of the cooling period (a). Reference numerals 30 and 31 denote a quartz substrate and a crystal silicon film, respectively. At this stage, the adhesion between the crystal silicon film 31 and the quartz substrate 30 at an interface 32 is not high, as a result of which many intragrain defects occur.

That is, it is considered that the crystal silicon film 31 that is given tension due to the difference in thermal expansion coefficient is very prone to move on the quartz substrate 30 and defects 33 such as stacking faults and dislocations are easily caused by such force as tensile stress.

The crystal silicon film that is obtained in the above manner is in the state of FIG. 14A. Thereafter, the catalyst element gettering step is executed at temperature $t_2$ as shown in FIG. 15A, whereby the defects in the crystal silicon film disappear for the above-described reasons.

In this step, it is an important point that in the catalyst element gettering step, the crystal silicon film is fixed to the quartz substrate 30 to improve the adhesion. That is, the gettering step also serves as a step of fixing the crystal silicon film to the quartz substrate 30 (underlying member).

After the completion of the gettering and fixing step, the crystal silicon film is cooled to the room temperature in a cooling period (b). In contrast to the case of the cooling period (a) after the crystallization step, in the cooling step (b) an interface 35 between the quartz substrate 30 and the annealed crystal silicon film 34 is in a state of very high adhesion (see FIG. 15C).

Where the adhesion is so high, the crystal silicon film 34 is completely fixed to the quartz substrate 30 and hence stress that is imposed on the crystal silicon film 34 in the cooling period (b) does not cause defects. That is, it can be prevented that defects are generated again.

Although FIG. 15A shows the process in which the temperature is reduced to the room temperature after the crystallization step, the gettering and fixing step may be performed by increasing the temperature immediately after the completion of the crystallization step. Such a process can also produce a crystal silicon film of the invention.

The crystal silicon film of the invention obtained in the above manner (see FIG. 14B) has a feature that the number of defects in crystal grains is much smaller than in the crystal silicon film as subjected to the crystallization step (see FIG. 14A).

In an electron spin resonance (ESR) analysis, the difference in the number of defects appears as a difference in spin density. At present, it has become apparent that the spin density of a crystal silicon film of the invention is $5 \times 10^{17}$ spins/cm$^3$ or less (preferably $3 \times 10^{17}$ spins/cm$^3$ or less). However, since this measurement value is close to the detection limit of the currently available measuring instruments, it is considered that the actual spin density is even lower.

The crystal silicon film of the invention having the above crystal structure and features is called by the present inventors a continuous grain silicon (CGS) film.

Knowledge Relating to Correspondence Grain Boundary

The correspondence boundaries described above are formed between grain boundaries oriented in the same direction. That is, the plane orientation of the semiconductor thin film of the invention substantially aligned with {110}. As a result, it is possible to form the correspondence boundaries covering a wide area. This feature does not appear in other polysilicon film with an irregular plane orientation.

Figure 18A:
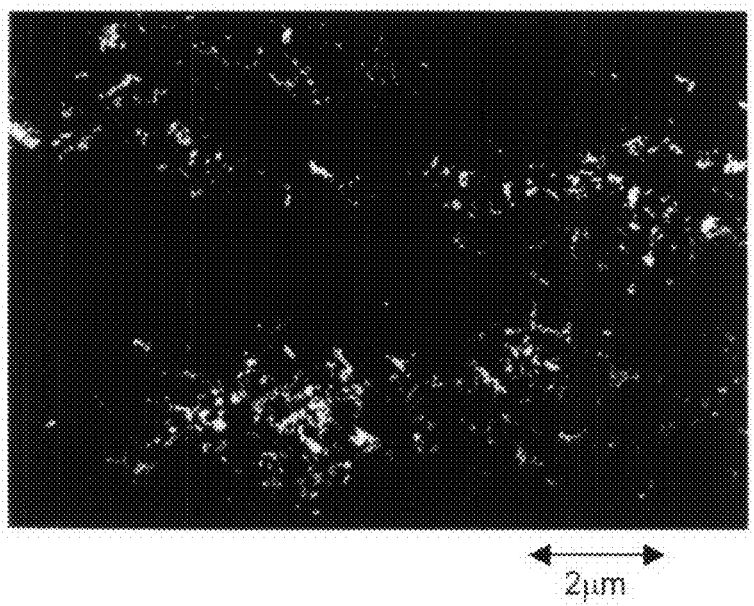
FIGS. 18A and 18B are TEM photographs showing dark field image of the semiconductor thin film.

In this embodiment, a TEM photograph (dark field image) with 15 thousand times of magnification of the semiconductor thin film of the invention is shown in FIG. 18A. There are regions that appear in white or black. However, the portion appeared in the same color indicates the portion having the same orientation.

In FIG. 18A, it should be featured that the regions appeared in white are considerably continuously collected in such a wide dark field view. This means that the crystal grains having the same orientation exist therein with having a certain direction, and adjacent crystal grains have substantially the same orientation.

Figure 18B:
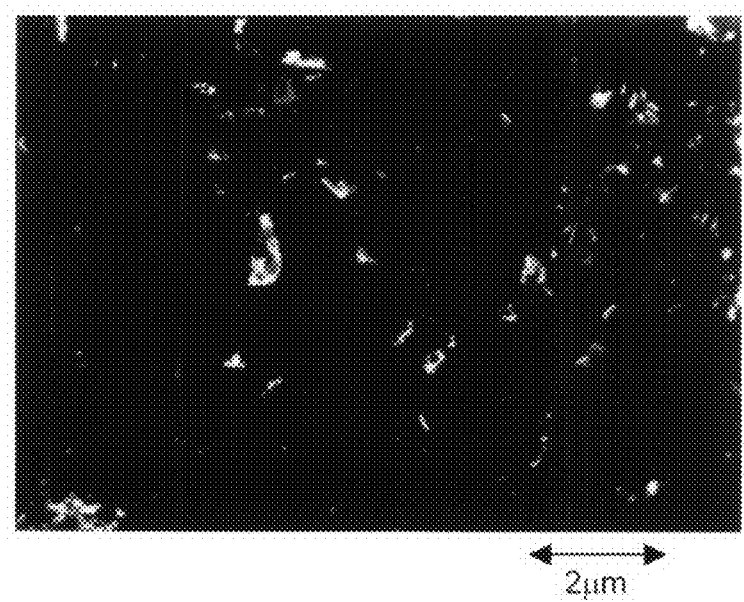

On the other hands, a TEM photograph (dark field image) with 15 thousand times of magnification of the conventional high temperature polysilicon film is shown in FIG. 18B. In the conventional high temperature polysilicon film, the regions having the same plane orientation are only dispersed therein, and any lump having a certain direction as shown in FIG. 18A cannot be found. It can be considered that the reason thereof is due to the irregularity of the orientation of the adjacent crystal grains to each other.

Figure 19:
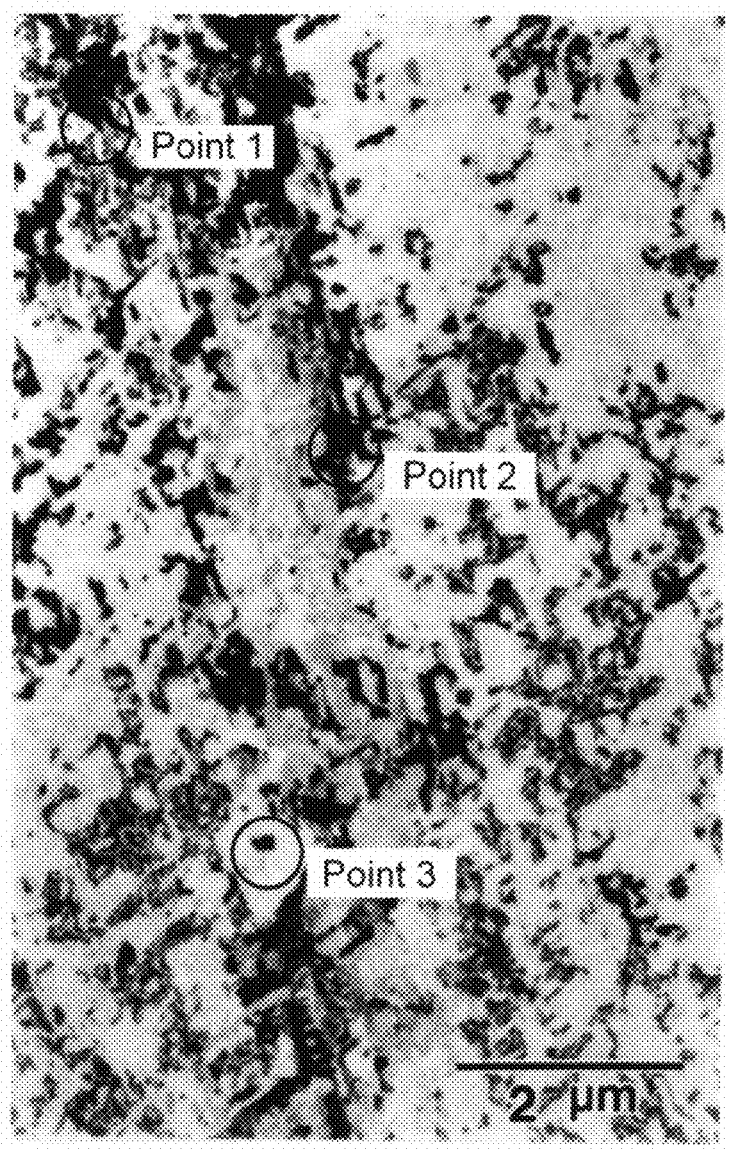
FIG. 19 is a TEM photograph showing light field image of the semiconductor thin film.
Figure 20A:
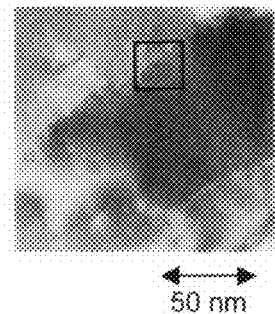
FIGS. 20A-20C are TEM photographs showing a state of grain boundaries of the semiconductor thin film.
Figure 20B:
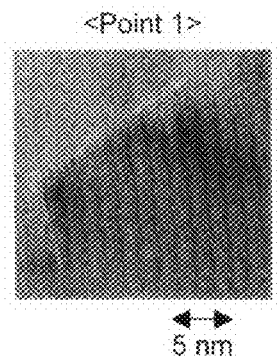
Figure 20C:
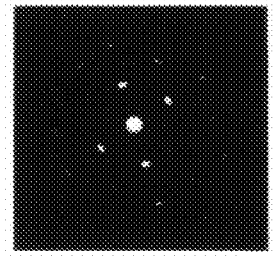

FIG. 19 also shows a TEM photograph of the semiconductor thin film of the invention which was carried out a nickel element gettering treatment by a technique described in embodiment 4 of the invention later, and was observed in light field. Further, a photograph in which Point 1 in FIG. 19 is magnified to 300 thousand times is shown in FIG. 20A. A photograph with 2 million times magnification thereof is also shown in FIG. 20B. It is to be noted that a region surrounded by a square in FIG. 20A corresponds to FIG. 20B. FIG. 20C also shows an electron deflection pattern (spot diameter: 1.7 µmφ) in Point 1.

Figure 21A:
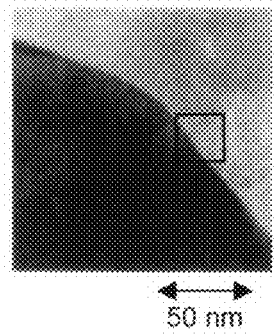
FIGS. 21A-21C are TEM photographs showing a state of grain boundaries of the semiconductor thin film.
Figure 21B:
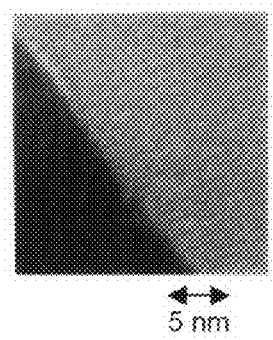
Figure 21C:
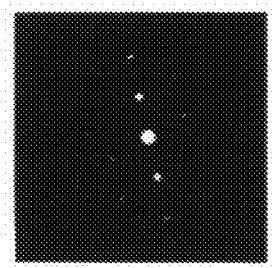
Figure 22A:
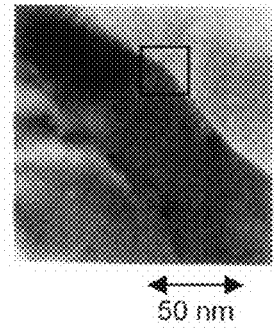
FIGS. 22A-22C are TEM photographs showing a state of grain boundaries of the semiconductor thin film.
Figure 22B:
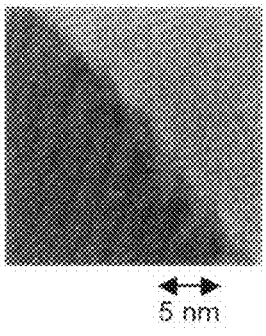
Figure 22C:
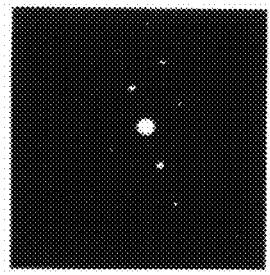

Further, Point 2 and Point 3 were observed under quite the same conditions as Point 1. Observation results of Point 2 were shown in FIGS. 21A to 21C, and observation results of Point 3 were shown in FIGS. 22A to 22C.

From these observation results, it was confirmed that the continuity of crystal lattices were kept so that plane boundaries are formed in an arbitral grain boundary. It should be noted that the inventors have repeated observation and measurement over a large number of regions other than the above-indicated measuring points. As a result, it was confirmed that the continuity of the crystal lattices in grain boundaries was ensured in a region that is sufficiently wide for manufacturing the TFT.

Embodiment 2

The first embodiment is directed to the case where to provide an underlying surface that is superior in flatness a silicon substrate is thermally oxidized in an atmosphere containing a halide (for instance, HCl). The second embodiment is directed to a case of using another type of substrate.

In this embodiment, first an inexpensive, low-grade quartz substrate is prepared. Then, the quartz substrate is polished, by, for instance, chemical mechanical polishing (CMP), into an ideal state that the average of height differences of recesses/protrusions is within 5 nm (typically within 3 nm; preferably within 2 nm).

In this manner, an insulating substrate having superior flatness can be obtained by polishing an inexpensive quartz substrate. The use of a quartz substrate enables provision of a very dense underlying surface, in which case the interface between the underlying surface and a semiconductor thin film is made highly stable. Having an additional advantage that a semiconductor thin film receives almost no influences of pollutants from the substrate, a quartz substrate is very high in utility value.

Embodiment 3

While the first embodiment is directed to the case of using a silicon film as a semiconductor film, it is effective to use a silicon film containing germanium at 1-10%, which is expressed by $Si_XGe_{1-X}$ (0<X<1; preferably $0.05 \leq X \leq 0.95$).

By using such a compound semiconductor film, the threshold voltage can be made small when an n-type or p-type TFT is manufactured. Further, the field-effect mobility can be increased.

Embodiment 4

The first embodiment is directed to the case where a halogen element is used in the step of gettering a catalyst element for accelerating crystallization of silicon. In the invention, it is also possible to use the element of phosphorus in the catalyst element gettering step.

Phosphorus may be used in such a manner that it is added to regions other than a region to become an active layer and a heat treatment is performed at 400°-1,050° C. (preferably 600°-750° C.) for 1 minute to 20 hours (typically 30 minutes to 3 hours). As a result of the heat treatment, the catalyst element is gettered in the phosphorus-added regions, whereby the concentration of the catalyst element in an active layer is reduced to $5 \times 10^{17}$ atoms/cm$^3$ or less.

After the gettering step has finished, an active layer is formed by using the region other than the phosphorus-added regions. Then, the same steps as in the first embodiment are executed, to produce a semiconductor device having the same features as in the first embodiment.

It goes without saying that if a heat treatment is performed in an atmosphere containing a halogen element in forming a thermal oxidation film that is to become a gate insulating film, a multiplier effect of the gettering effect of phosphorus according to this embodiment and the gettering effect of the halogen element can be obtained.

Embodiment 5

Figure 7:
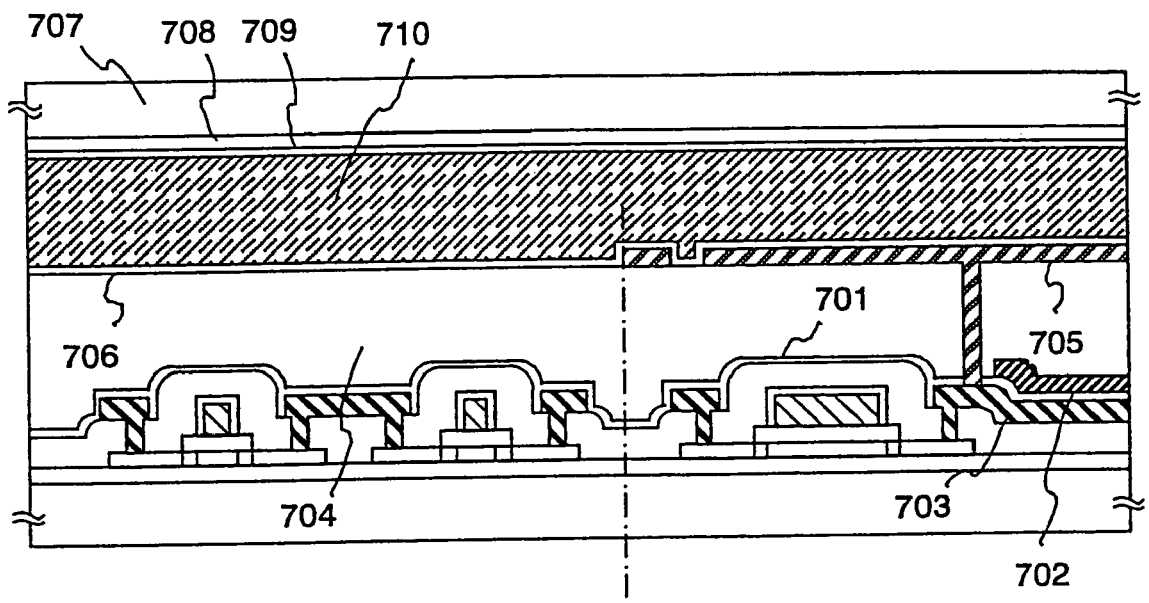
FIG. 7 is a sectional view of an electro-optical device according to a fifth embodiment of the invention.

This embodiment is directed to a case of constructing a reflection-type liquid crystal panel by using semiconductor devices according to the first embodiment. FIG. 7 is a sectional view of an active matrix liquid crystal panel in which a CMOS circuit is formed in an area of a driver circuit or a logic circuit and a pixel TFT is formed in an area of a pixel matrix circuit.

The CMOS circuit is formed by complementarily combining an n-channel TFT and a p-channel TFT. Since the structure and the manufacturing method of each TFT constituting the CMOS circuit are the same as in the first embodiment, descriptions therefor are omitted.

To produce the pixel TFT, it is necessary to further improve a TFT as used to constitute a driver circuit etc. In FIG. 7, a silicon nitride film 701 serves as not only a passivation film of the CMOS circuit but also an insulator for constituting an auxiliary capacitor.

A titanium film 702 is formed on the silicon nitride film 701, and an auxiliary capacitor is formed between the titanium film 702 and a drain electrode 703. Since the insulator is a silicon nitride film having large relative permittivity, the capacitance can be made large. Since in the reflection-type panel there is no need for considering the aperture ratio, the structure of FIG. 7 causes no problem.

An interlayer insulating film 704 is an organic resin film, which is a polyimide film in this embodiment. It is preferable to secure flatness of a sufficiently high level by making the interlayer insulating film 704 as thick as about 2 μm. As a result, a pixel electrode 705 having superior flatness can be formed.

The pixel electrode 705 is made of aluminum or a material having aluminum as the main component. It is better to use a material having as high reflectance as possible. Further, by securing superior flatness, the loss due to diffused reflection at the pixel electrode surface can be reduced.

An alignment film 706 is formed on the pixel electrode 705. The alignment film 706 is given alignment ability by rubbing it. The description made so far is directed to the configuration of a TFT substrate (active matrix substrate).

On the other hand, an opposed substrate is constructed by forming a transparent conductive film 708 and an alignment film 709 on a transparent substrate 707. A black mask or color filters may be added when necessary.

After spacers are scattered and a sealing member is printed, a liquid crystal layer 710 is introduced and sealed, to complete a reflection-type liquid crystal panel having the structure shown in FIG. 7. The kind of the liquid crystal layer 710 can be selected as desired in accordance with the operation mode (ECB mode, guest-host mode, or the like) of the liquid crystal.

Figure 8:
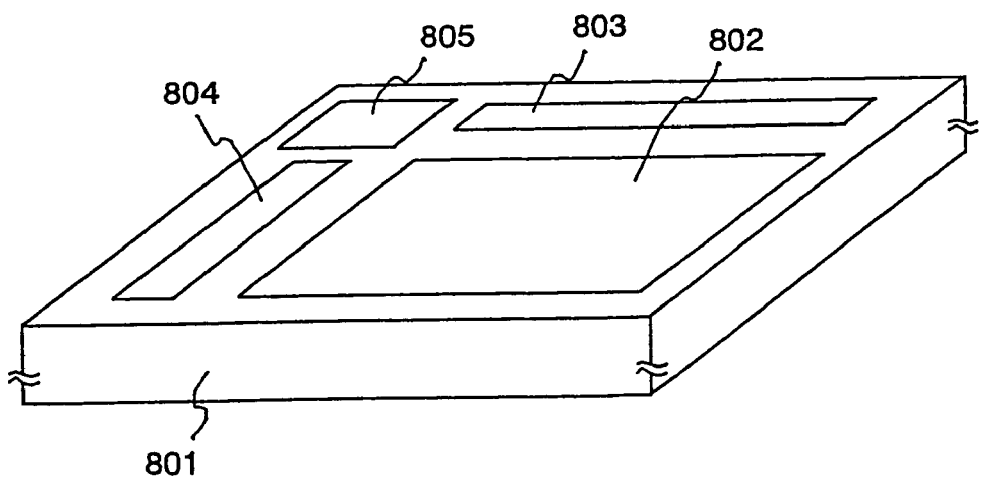
FIG. 8 shows an appearance of an active matrix substrate according to the fifth embodiment.

FIG. 8 shows, in a simplified manner, an appearance of an active matrix substrate constituting a reflection-type liquid crystal panel as shown in FIG. 7. In FIG. 8, reference numeral 801 denotes a silicon substrate on which a thermal oxidation film is formed according to the process of the first embodiment. Numeral 802 denotes a pixel matrix circuit; 803, a source driver circuit; 804, a gate driver circuit; and 805, a logic circuit.

Although in a broad sense the logic circuit 805 includes all logic circuits that are constituted of TFTs, in this embodiment it means signal processing circuits (a memory, a D/A converter, a clock generator, etc.) other than those logic circuits to discriminate it from circuits conventionally called a pixel matrix circuit or a driver circuit.

The liquid crystal panel thus formed is provided with FPC (flexible print circuit) terminals as external terminals. Liquid crystal panels that are commonly called a liquid crystal module is ones provided with FPC terminals.

Embodiment 6

This embodiment is directed to a case of constructing a transmission-type liquid crystal panel by using semiconductor devices according to the first embodiment. This embodiment will be described with reference to FIG. 9. Since the basic configuration of this embodiment is the same as that of the reflection-type liquid crystal panel of the fifth embodiment, different points will mainly be described below.

Figure 9:
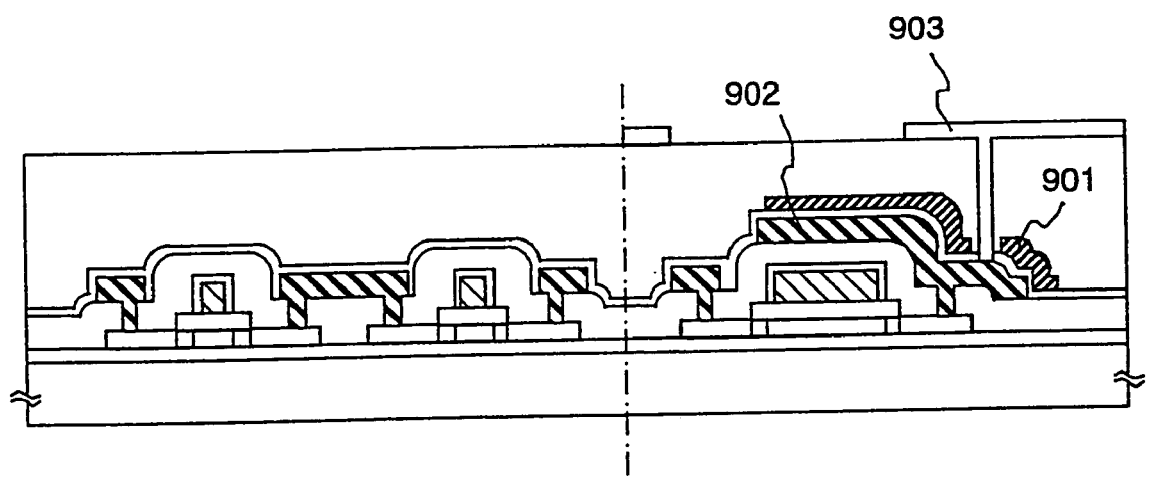
FIG. 9 is a sectional view of an active matrix substrate according to a sixth embodiment of the invention.

A transmission-type liquid crystal panel shown in FIG. 9 is much different from the reflection-type liquid crystal panel in the is structure of a black mask 901. That is, in the transmission type, to increase the aperture ratio, it is important that the area of those portions other than a TFT portion and wiring portions which are covered with the black mask 901 be minimized.

To this end, in this embodiment, a drain electrode 902 is formed so as to overlap with the TFT portion and an auxiliary capacitor is formed between the black mask 901 and the drain electrode 902 above the TFT portion. By forming the auxiliary capacitor that occupies a large area above the TFT portion, a large aperture ratio can be obtained.

Reference numeral 903 denotes a transparent conductive film as a pixel electrode. Although ITO is most frequently used as a material of the transparent conductive film 903, other materials such as tin oxide may also be used.

Figure 23A:
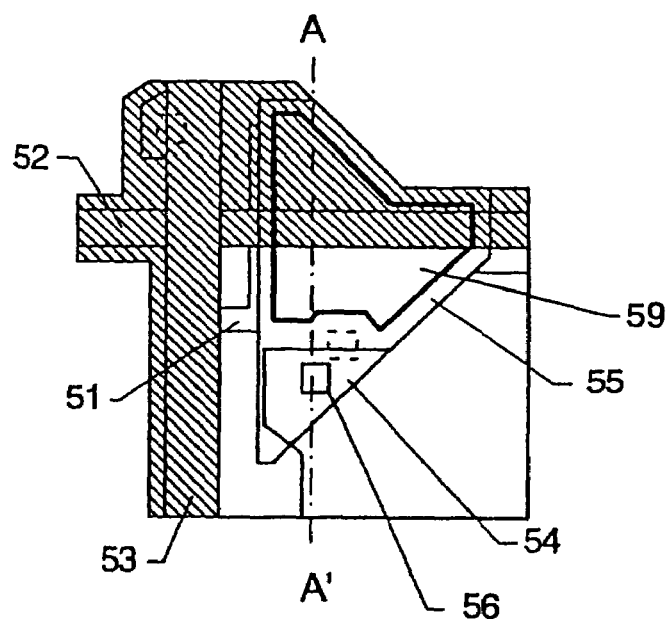
FIGS. 23A and 23B are views showing a top and a sectional structure of a pixel TFT, respectively.

FIG. 23A shows a top view of a pixel structure of the embodiment, in which attention is attached to a pixel TFT portion. In FIG. 23A, reference numerals 51 to 55 denote an active layer, a source line, a gate line, a drain electrode, and black mask, respectively.

Reference numeral 56 also denotes a contact hole for connecting the drain electrode 54 to a pixel electrode 57.

The feature of this embodiment resides in that an auxiliary capacitor 59 is formed between the drain electrode 54 and the black mask 55 above the pixel TFT portion.

Figure 23B:
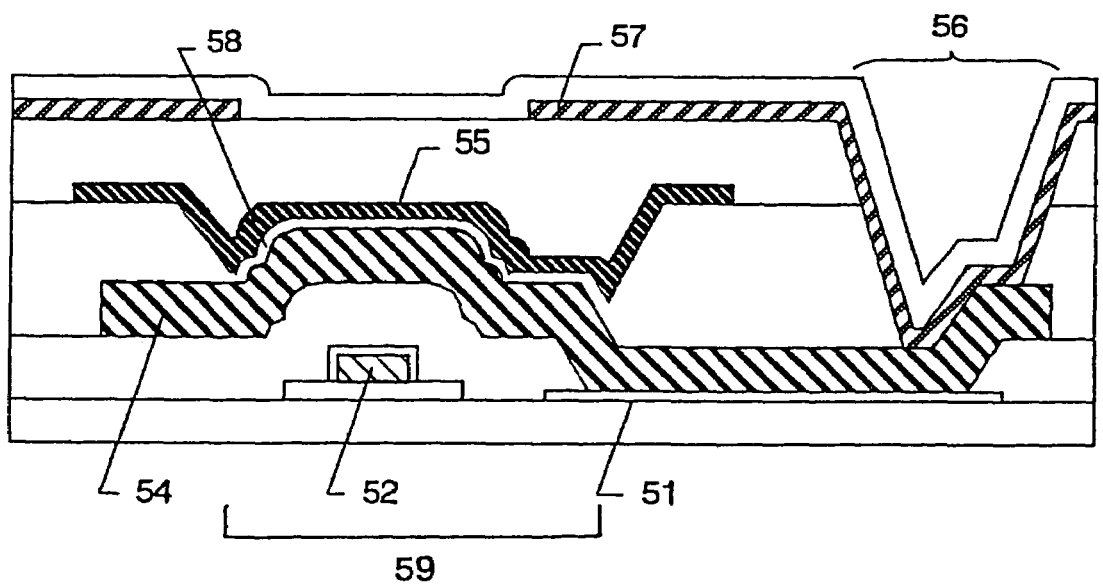
Figure 24:
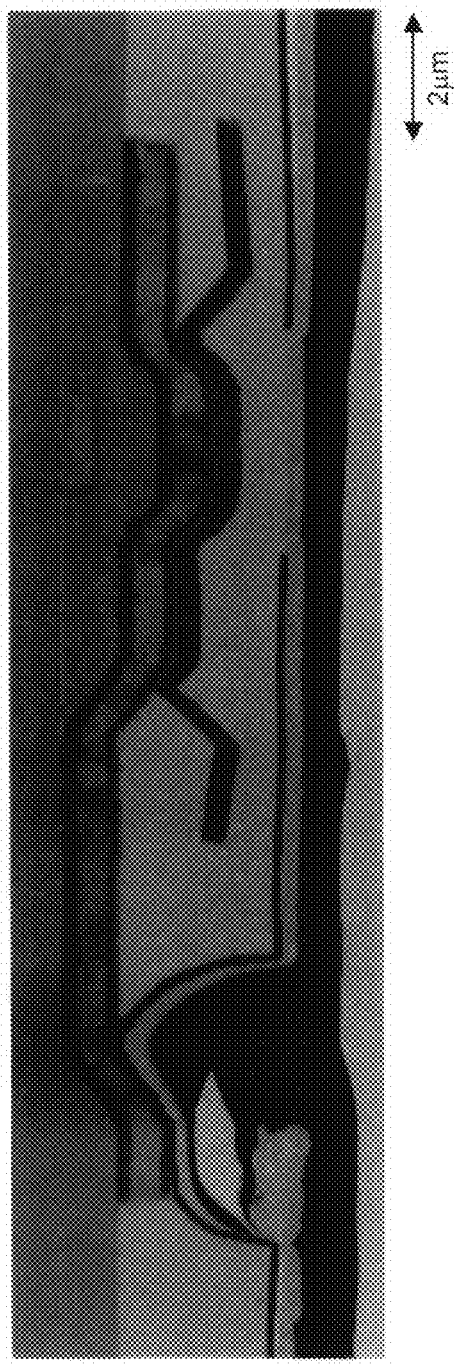
FIG. 24 is a TEM photograph showing a sectional structure of a pixel TFT.

FIG. 23B shows a sectional structure cut along the broken line A-A'. Same reference numerals are used in FIGS. 23A and 23B. Further, FIG. 24 shows a TEM photograph in which the cross section corresponding to FIG. 23B is actually photographed.

As described above, the drain electrode 55 is formed so as to be overlapped with the gate line, and the auxiliary capacitor 59 is formed between the facing black mask 55 while sandwiching a dielectric 58. In this embodiment, three-layer structure is employed in which a titanium film as the drain electrode 54 is sandwiched between aluminium films.

In this embodiment, the drain electrode 54 is formed, then an interlayer insulating film of three-layer structure consisting of a silicon nitride film, a silicon oxide film, and a acrylic film is formed, and the black mask 55 is formed thereupon.

In this case, before forming the black mask 55, the acrylic film only in the region where the auxiliary capacitor 59 will be formed later, is removed, thereby forming an opening. As a result, only silicon oxide and silicon nitride are remained at the bottom of the opening, and the insulating layer of two-layer structure functions as the dielectric 58 for the auxialily capacitor 59.

Embodiment 7

This embodiment is directed to a case where the invention is applied to what is called a silicon-gate TFT in which a conductive silicon film is used as a gate electrode. Since the TFT of this embodiment has approximately the same basic structure as that of the first embodiment, only different points will be described below.

Figure 10:
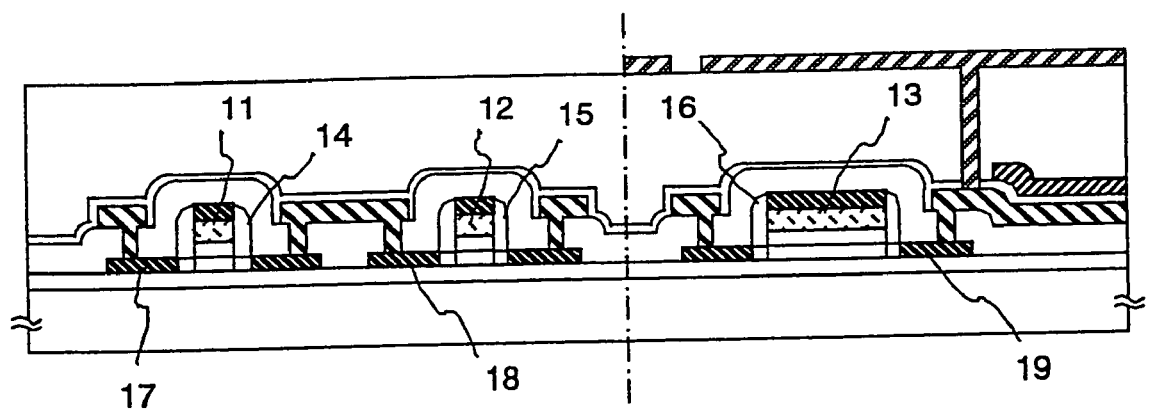
FIG. 10 is a sectional view of an active matrix substrate according to a seventh embodiment of the invention.

Referring to FIG. 10, reference numerals 11-13 denote gate electrodes of an n-channel TFT, a p-channel TFT, and a pixel TFT, respectively. The gate electrodes 11-13 are made of an n-type polysilicon film to which phosphorus or arsenic is added or a p-type polysilicon to which boron or indium is added.

The CMOS circuit may be a dual gate CMOS circuit in which an n-type polysilicon gate is used in the n-channel TFT and a p-type polysilicon gate is used in the p-channel TFT.

Using a silicon film as the gate electrode in the above manner has advantages that the heat resistance is high and the silicon film is easy to handle. Further, a salicide structure (including a polycide structure) can be formed by utilizing reaction with a metal film.

To this end, sidewalls 14-16 are formed after formation of the gate electrode 11-13. Then, after a metal film (not shown) such as a tungsten film or a titanium is formed, metal silicide films 17-19 are formed by performing a heat treatment. The metal silicide films 17-19 are formed as part of the source and drain electrodes and the gate electrode.

The structure in which a metal silicide film is formed in a self-aligned manner by using a sidewall or the like in this manner is called the salicide structure. This structure is effective because good ohmic contact to the pickup electrodes (source and drain electrodes etc.) can be obtained.

Embodiment 8

This embodiment is directed to a case of using germanium as a catalyst element in crystallizing an amorphous silicon film. This embodiment will be described with reference to FIGS. 16A-16C.

First, a quartz substrate is prepared as a substrate 41. An insulating film such as a silicon oxide film may be formed as an undercoat film, if necessary.

Figure 16A:
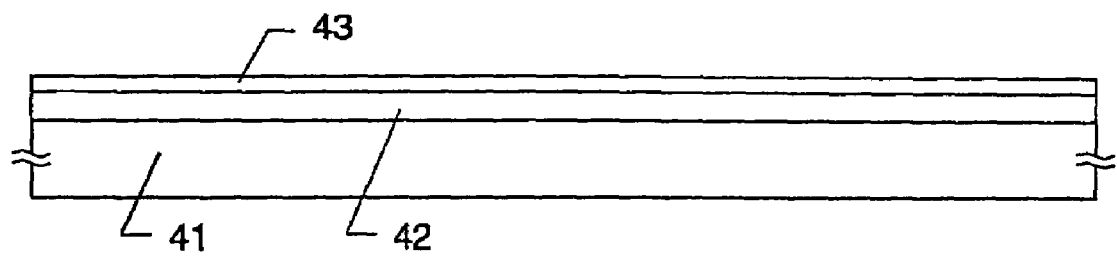
FIGS. 16A-16C show a manufacturing process of a semiconductor device according to an eighth embodiment of the present invention.

Then, an amorphous silicon film 42 is formed by low-pressure CVD by using disilane ($Si_2H_6$) as a film forming gas (see FIG. 16A). In this embodiment, the thickness of the amorphous silicon film 42 is set at 75 nm.

Then, a step of crystallizing the amorphous silicon film 42 is executed. In this embodiment, germanium is used as a catalyst element for accelerating crystallization in crystallizing the amorphous silicon film 42. In this embodiment, a germanium film 43 is formed on the amorphous silicon film 42 by plasma CVD.

A germane ($GeH_4$) gas diluted with hydrogen or helium by a factor of 5 to 10 is used as a film forming gas. Then, a germanium film 43 of 1-50 nm (typically 10-20 nm) in thickness can be formed by causing discharge at 20-50 mW/cm$^2$ at a film forming temperature of 100°-300° C.

Alternatively, the germanium film 43 maybe formed by low-pressure CVD. Since a germane gas is very apt to decompose, a germanium film can be formed with easy decomposition of a germane gas at as low a temperature as about 450° C.

Figure 16B:
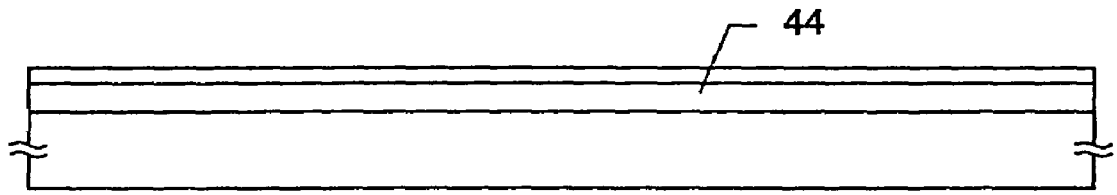

The state of FIG. 16A is thus obtained. Then, the amorphous silicon film 42 is crystallized by performing a heat treatment at 450°-650° C. (preferably 500°-550° C.) as shown in FIG. 16B. The reason why the upper limit temperature is set at 600° C. is that at a temperature higher than 600° C. the rate of occurrence of natural nuclei increases to such a level that they are mixed with crystals that are formed with germanium atoms as nuclei, to cause disorder in crystallinity.

In the crystallization step, any of furnace annealing, lamp annealing, and laser annealing may be employed. In this embodiment, furnace annealing is employed with importance attached to the uniformity of a resulting film.

A resulting crystal silicon film (polysilicon film) 44 has superior crystallinity in spite of the fact that it has been formed at as low a temperature as about 500° C.

Figure 16C:
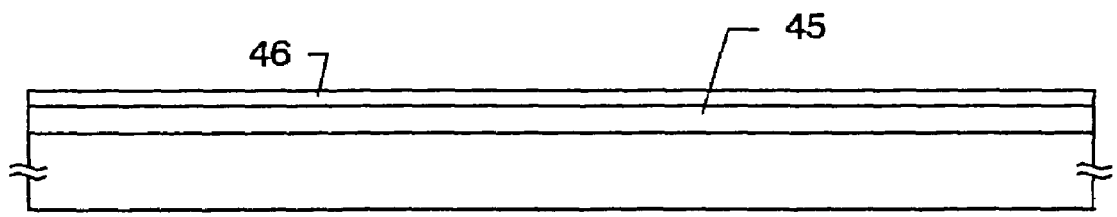

Then, after the residual germanium film on the crystal silicon film 44 is removed with a sulfuric acid-hydrogen peroxide solution ($H_2SO_4$:$H_2O_2$=1:1), a heat treatment is performed on the crystal silicon film 44 at a temperature (800°-1,050° C.) at least higher than the above-mentioned crystallization temperature (see FIG. 16C).

Where germanium is used as the catalyst element for accelerating crystallization of silicon as in this embodiment, there is no particular reason for removing germanium by gettering it. It is considered that since germanium is a semiconductor element belonging to the same group as silicon and they are compatible with each other, germanium does not adversely affect the semiconductor characteristics of silicon.

A crystal silicon film 45 having high crystallinity is formed by the heat treatment step. A thermal oxidation film 46 is formed on the crystal silicon film 45 by the heat treatment step. The thermal oxidation film 46 can be used, as it is, as a gate insulating film in forming a TFT.

The heat treatment may be performed in a state that the germanium film is left, in which case germanium comes to exist in the film at a high concentration. In either case, after the heat treatment step, diffusion causes germanium to exist in the crystal silicon film 45 at a concentration of $1\times10^{14}$ to $5\times10^{19}$ atoms/cm³ (typically $1\times10^{15}$ to $1\times10^{16}$ atoms/cm³).

Therefore, the crystal silicon film 45 formed in this embodiment is a semiconductor film that contains many bonds where a silicon atom is replaced by a germanium atom and is close to a silicon-germanium semiconductor that is expressed by $Si_XGe_{1-X}$ (0<X<1).

The manufacturing process of this embodiment has an advantage that abnormal growth of silicon oxide does not occur at all on the crystal silicon film 45. That is, abnormal growth of silicon oxide does not occur with the crystal silicon film 45 that is formed by the process of this embodiment even if thermal oxidation is performed in a state that the crystal silicon film 45 is in contact with an oxidizing atmosphere.

The present assignee confirmed that where nickel is used as a catalyst for crystallization, abnormal growth of silicon oxide occurs in a later heat treatment step depending on its conditions. This is due to concentrated oxidation of nickel silicide existing in the crystal silicon film. No such abnormal growth occurs in this embodiment.

Further, the heat treatment step of FIG. 16C can remove, almost completely, intragrain defects that existed in the crystal silicon film 44. The crystal silicon film 44 as crystallized, that is, in the state of FIG. 16B, has many defects (stacking faults, dislocations, etc.) in crystal grains. However, the crystal silicon film 45 obtained by the step of FIG. 16C has almost no defects in crystal grains.

The present assignee infers that the absence of defects is caused by phenomena similar to those that were explained in the first embodiment by using the models. However, it is considered that since nickel is not used as a catalyst element, the extinction of defects is mainly owed to the influence of excess silicon atoms generated by the thermal oxidation.

Although in the process of FIG. 15A the temperature is reduced to the room temperature after the completion of the crystallization step, the fixing step may be performed by increasing the temperature immediately after the completion of the crystallization step. Such a process can produce a crystal silicon film having similar crystallinity.

As described above, by employing the process of this embodiment, abnormal oxidation of a crystal silicon film can be prevented and hence the heat treatment step for the crystal silicon film does not become unduly complex. Further, intragrain defects in the crystal silicon film are removed whereby the crystal silicon film is given very high crystallinity.

The temperature higher than the crystallization temperature is typically 800°-1,050° C. (preferably 850°-900° C.). This embodiment is characterized in performing the heat treatment at such a high temperature. Since it is considered that in this step the thermal oxidation greatly contributes to the reduction of intragrain defects, it is desirable that this step be executed under such conditions as to facilitate thermal oxidation.

Therefore, in view of the throughput, it is preferable to set the lower limit temperature of the heat treatment at 800° C. In view of the heat resistance of the substrate (in this embodiment, the quartz substrate), it is preferable to set the upper limit temperature at 1,050° C. However, since the melting point of germanium is 930°-940° C., it is even preferable to set the upper limit temperature at 900° C.

It is preferable that the heat treatment atmosphere be an oxidizing atmosphere, it may be an inert atmosphere. The oxidizing atmosphere may be one of a dry oxygen ($O_2$) atmosphere, a wet oxygen ($O_2+H_2$) atmosphere, and an atmosphere containing a halogen element ($O_2$+HCl or the like).

In particular, if the heat treatment is performed in an atmosphere containing a halogen element, excess germanium atoms existing between the lattice points of crystal silicon are removed in the form of $GeCl_4$ that is volatile by the gettering effect of the halogen element. Therefore, this is an effective means for obtaining a crystal silicon film with less lattice strains.

The crystal silicon film of this embodiment formed by the above-described manufacturing method has very high crystallinity.

Embodiment 9

Since a TFT according to the invention is formed by using, as its active layer, a semiconductor thin film that can substantially be regarded as a single crystal, it exhibits electric characteristics equivalent to those of a MOSFET using single crystal silicon. TFTs that were produced experimentally by the inventors provided the following data.

(1) For each of an n-channel TFT and a p-channel TFT, the subthreshold coefficient that is an index of the switching performance (quickness of switching between on and off operations) of a TFT is as small as 60-100 mV/decade (typically 60-85 mV/decade).

(2) The field-effect mobility ($\mu_{FE}$) that is an index of the operation speed of a TFT is as large as 200-650 cm²/Vs (n-channel TFT; typically 250-300 cm²/Vs) or as large as 100-300 cm²/Vs (p-channel TFT; typically 150-200 cm²/Vs).

(3) The threshold voltage ($V_{th}$) that is an index of the drive voltage of a TFT is as small as –0.5 to 1.5 V (n-channel TFT) or as small as –1.5 to 0.5 V (p-channel TFT).

As described above, a TFT produced by the invention has a far superior switching characteristic and high-speed operation characteristic. This enables integrated circuits such as an LSI to be constructed by using TFTs rather than MOSFETs that are conventionally used.

Further, by utilizing the advantages of the TFT in which a thin film is used, a three-dimensional semiconductor device (semiconductor circuit) can be constructed.

Figure 11A:
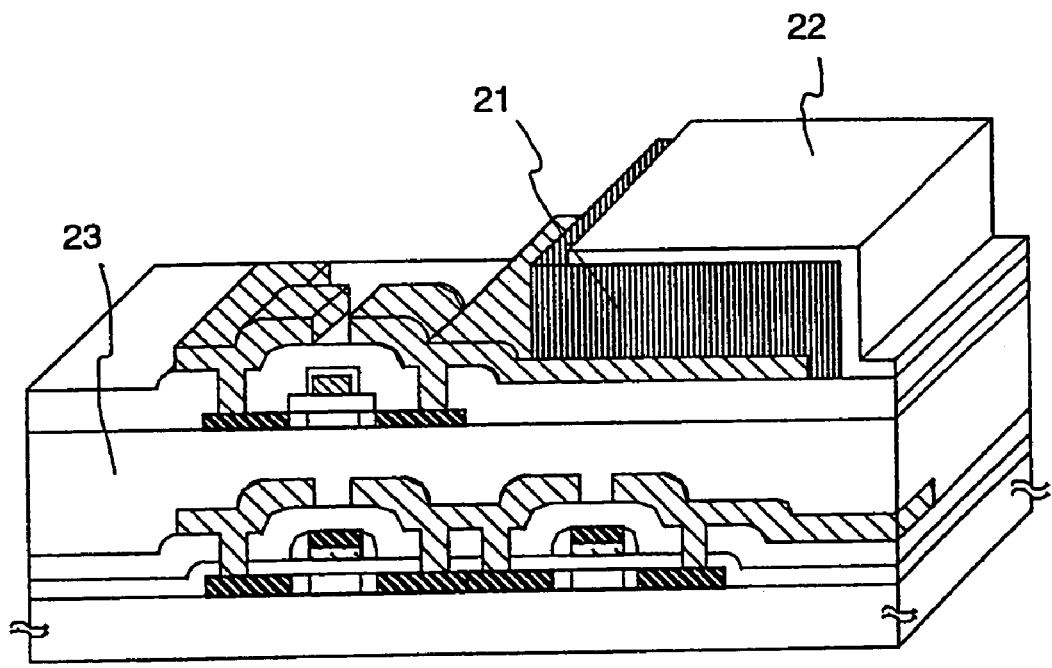
FIGS. 11A and 11B show examples of three-dimensional semiconductor circuits according to a ninth embodiment of the invention.
Figure 11B:
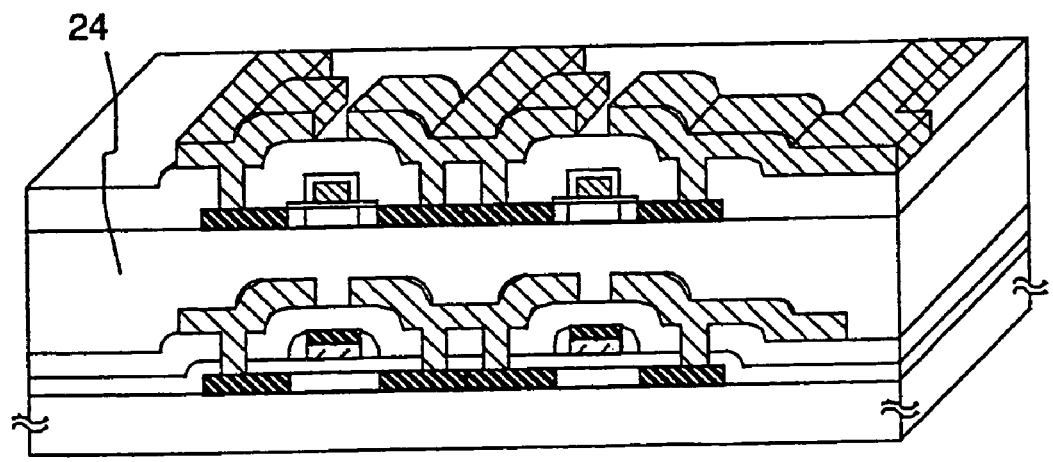

FIGS. 11A and 11B show examples of three-dimensional semiconductor circuits using TFTs of the invention. FIG. 11A shows a three-dimensional circuit in which TFTs are formed in the bottom layer and an image sensor is formed in the top layer. FIG. 11B shows a three-dimensional circuit in which TFTs are formed in each of the bottom layer and the top layer.

In FIG. 11A, a photoelectric conversion layer 21 may be made of an amorphous silicon film or the like. A top electrode (transparent conductive film) 22 is formed on the photoelectric conversion layer 21, to thereby constitute a photodetecting section for receiving light and converting it into an electrical signal.

Since the manufacturing process for producing the TFTs is the same as in the first embodiment, it is not described here. The multi-layers forming technique for constructing the three-dimensional 1 circuit may be a known one. However, in forming the top. TFT layer, it is necessary to consider the heat resistance of the TFTs in the bottom layer.

For example, the three-dimensional circuit may have a configuration in which TFTs according to the invention are used in the bottom layer and conventional, low-temperature formation TFTs are used in the top layer. Or the three-dimensional circuit may have a configuration in which TFTs made of a highly heat-resistant material are used in the bottom layer and TFTs according to the invention are used in the top layer.

A further alternative may be such that the image sensor in the top layer is composed of only the photodetecting section and photodetecting section is controlled by the TFTs in the bottom layer.

In FIG. 11B, the bottom layer is the TFT layer using a silicon-gate structure and the top layer is the TFT layer in which a silicon-gate structure or a metal film (for instance, a film having aluminum as the main component) is used as a gate electrode. The manufacturing process of the TFTs of FIG. 11B is not described either.

Also in the configuration of FIG. 11B, the top TFT layer needs to be formed with sufficient consideration given to the heat resistance of the TFTs in the bottom layer.

In each case of FIGS. 11A and 11B, employment of the following steps is desirable. First, a thick interlayer insulating film 23 or 24 is formed after the formation of the TFTs in the bottom layer. Then, after the interlayer insulating film 23 or 24 is planarized by polishing such as chemical mechanical polishing (CMP), the TFTs in the top layer are formed.

By forming a three-dimensional semiconductor circuit by using TFTs of the invention, a semiconductor circuit having a wide variety of functions can be constructed. In this specification, the term "semiconductor circuit" means an electric circuit for controlling/converting an electrical signal by utilizing the semiconductor characteristics.

It is also possible to construct a LCD driver circuit, a high-frequency circuit (MMIC: microwave module IC) for portable equipment, etc. by using TFTs of the invention. That is, the use of TFTs of the invention makes it possible to construct IC chips and LSI chips by using TFTs.

Embodiment 10

In addition to a liquid crystal display device, other electro-optical devices such as an active matrix EL (electroluminescence) display device and an EC (electrochromic) display device as well as an image sensor and a CCD can be constructed according to the invention.

The term "electro-optical device" means a device for converting an electrical signal to an optical signal, or vice versa.

Embodiment 11

In this embodiment, examples of electronic apparatuses (application products) using an electro-optical device according to the invention will be described with reference to FIGS. 12A-12F. The term "electronic apparatus" means a product incorporating a semiconductor circuit and/or an electro-optical device.

Examples of electronic apparatuses to which the invention can be applied are a video camera, an electronic still camera, a projector, a head-mounted display, a car navigation apparatus, a personal computer, and portable information terminals (a mobile computer, a cellular telephone, a PHS (personal handyphone system) telephone, etc.).

Figure 12A:
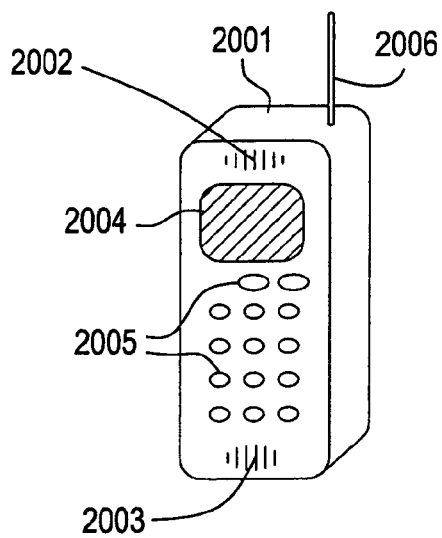
FIGS. 12A-12F show examples of electronic apparatuses according to an 11th embodiment of the invention.

FIG. 12A shows a cellular telephone, which is composed of a main body 2001, a voice output section 2002, a voice input section 2003, a display device 2004, manipulation switches 2005, and an antenna 2006. The invention can be applied to the voice output section 2002, the voice input section 2003, the display device 2004, etc.

Figure 12B:
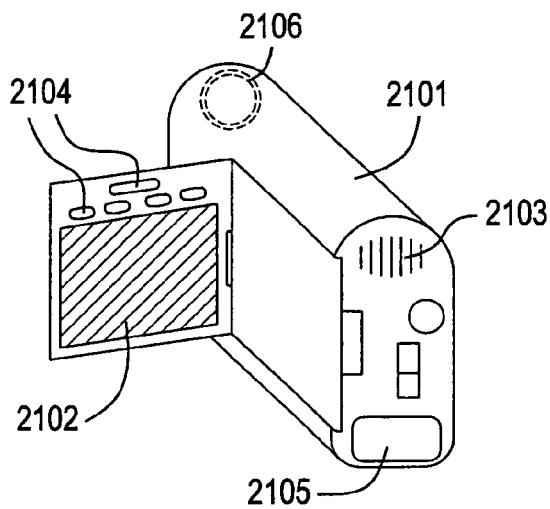

FIG. 12B shows a video camera, which is composed of a main body 2101, a display device 2102, a sound input section 2103, manipulation switches 2104, a battery 2105, and an image receiving section 2106. The invention can be applied to the display device 2102, the sound input section 2103, the image receiving section 2106, etc.

Figure 12C:
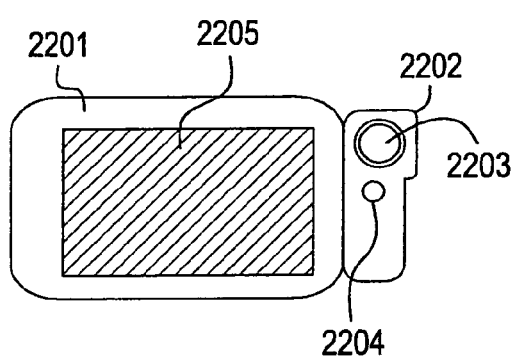

FIG. 12C shows a mobile computer, which is composed of a main body 2201, a camera section 2202, an image receiving section 2203, a manipulation: switch 2204, and a display device 2205. The invention can be applied to the camera section 2202, the image receiving section 2203, the display device 2205, etc.

Figure 12D:
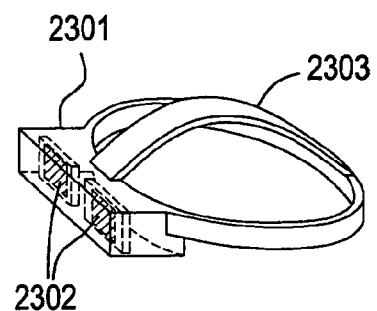

FIG. 12D shows a head-mounted display, which is composed of a main body 2301, display devices 2302, and a band section 2303. The invention can be applied to the display device 2302.

Figure 12E:
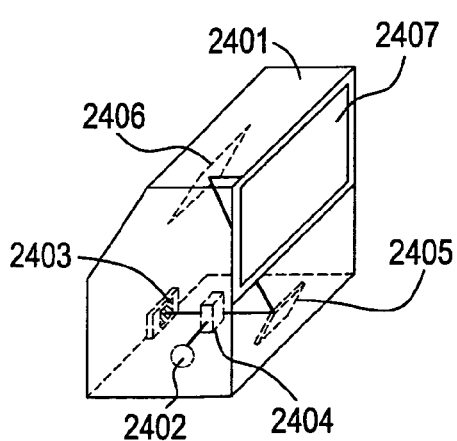

FIG. 12E shows a rear projector, which is composed of a main body 2401, a light source 2402, a display device 2403, a polarizing beam splitter 2404, reflectors 2405 and 2406, and a screen 2407. The invention can be applied to the display device 2403.

Figure 12F:
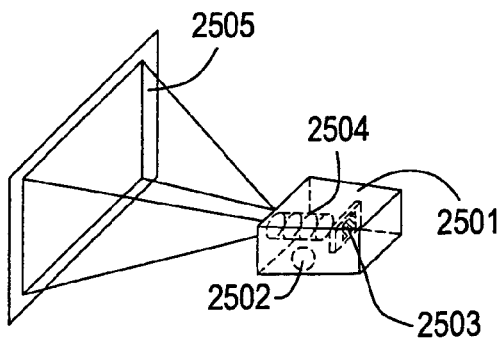

FIG. 12F shows a front projector, which is composed of a main body 2501, a light source 2502, a display device 2503, an optical system 2504, and a screen 2505. The invention can be applied to the display device 2503.

As described above, the invention has an extremely wide application range and can be applied to electronic apparatuses of every field. Further, the invention can be applied to any product that requires an electro-optical device or a semiconductor circuit.

The invention enables formation of a semiconductor thin film having such crystallinity as to substantially be regarded as a single crystal, and makes it possible to realize, by using such a semiconductor thin film, a TFT exhibiting high performance that is equivalent to or even higher than the performance of a MOSFET formed on a single crystal.

A semiconductor circuit and an electro-optical device that are formed by using TFTs of the above kind, and an electronic apparatus incorporating such a semiconductor circuit or electro-optical device have extremely high performance and are products that are superior in functionality, portability, and reliability.

What is claimed is:

1. A portable information terminal having a display device, the display device comprising:
a semiconductor circuit having a semiconductor film formed over a substrate,
wherein the semiconductor film is a crystalline silicon film having crystal grains,
wherein each of diffraction spots of an electron beam diffraction pattern of the semiconductor film is substantially circular, and
wherein a ratio of a minor-axis length to a major-axis length of each of the diffraction spots is in a range of 1/1 to 1/1.5.

2. A portable information terminal according to claim 1, wherein the portable information terminal is a mobile computer or a cellular phone.

3. A portable information terminal according to claim 1, wherein, the display device is selected from the group consisting of a liquid crystal display device, an electrochromic display device and an electroluminescence display device.

4. A portable information terminal according to claim 1, wherein a main orientation plane of the semiconductor film substantially coincides with a {110} plane.

5. A portable information terminal having a display device, the display device comprising:
a semiconductor circuit having a semiconductor film formed over a substrate,
wherein the semiconductor film is a crystalline silicon film having crystal grains,
wherein each of diffraction spots of an electron beam diffraction pattern of the semiconductor film has a spread that is on a concentric circle having a center at a central point of an electron beam irradiation area, and wherein a tangential line to each of the diffraction spots from the central point of the electron beam irradiation area and a line segment connecting the central point of the electron beam irradiation area and a central point of each of the diffraction spots form an angle that is within ±1.5° or less.

6. A portable information terminal according to claim 5, wherein the portable information terminal is a mobile computer or a cellular phone.

7. A portable information terminal according to claim 5, wherein the display device is selected from the group consisting of a liquid crystal display device, an electrochromic display device and an electroluminescence display device.

8. A portable information terminal according to claim 5, wherein a main orientation plane of the semiconductor film substantially coincides with a {110} plane.

9. A portable information terminal having a display device, the display device comprising:

a semiconductor circuit having a semiconductor film formed over a substrate, wherein the semiconductor film is a crystalline silicon film, wherein the semiconductor film comprises a collected body of a plurality of rod-like or flat-rod-like crystals, and wherein the rod-like or flat-rod-like crystals contact each other while forming rotation angles having absolute values that are within 3°.

10. A portable information terminal according to claim 9, wherein the portable information terminal is a mobile computer or a cellular phone.

11. A portable information terminal according to claim 9, wherein the display device is selected from the group consisting of a liquid crystal display device, an electrochromic display device and an electroluminescence display device.

12. A portable information terminal according to claim 9, wherein a main orientation plane of the semiconductor film substantially coincides with a {110} plane.

13. A portable information terminal having a display device, the display device comprising:

a semiconductor circuit having a semiconductor film formed over a substrate, wherein the semiconductor film is a crystalline silicon film having crystal grains, wherein the semiconductor film is an active layer of a thin film transistor, wherein each of diffraction spots of an electron beam diffraction pattern of the semiconductor film is substantially circular, and wherein a ratio of a minor-axis length to a major-axis length of each of the diffraction spots is in a range of 1/1 to 1/1.5.

14. A portable information terminal according to claim 13, wherein the portable information terminal is a mobile computer or a cellular phone.

15. A portable information terminal according to claim 13, wherein the display device is selected from the group consisting of a liquid crystal display device, an electrochromic display device and an electroluminescence display device.

16. A portable information terminal according to claim 13, wherein a main orientation plane of the semiconductor film substantially coincides with a {110} plane.

17. A portable information terminal having a display device, the display device comprising:

a semiconductor circuit having a semiconductor film formed over a substrate, wherein the semiconductor film is a crystalline silicon film having crystal grains, wherein the semiconductor film is an active layer of a thin film transistor, wherein each of diffraction spots of an electron beam diffraction pattern of the semiconductor film has a spread that is on a concentric circle having, a center at a central point of an electron beam irradiation area, and wherein a tangential line to each of the diffraction spots from the central point of the electron beam irradiation area and a line segment connecting the central point of the electron beam irradiation area and a central point of each of the diffraction spots form an angle that is within ±1.5° or less.

18. A portable information terminal according to claim 17, wherein the portable information terminal is a mobile computer or a cellular phone.

19. A portable information terminal according to claim 17, wherein the display device is selected from the group consisting of a liquid crystal display device, an electrochromic display device and an electroluminescence display device.

20. A portable information terminal according to claim 17, wherein a main orientation plane of the semiconductor film substantially coincides with a {110} plane.

21. A portable information terminal having a display device, the display device comprising:

a semiconductor circuit having a semiconductor film formed over a substrate, wherein the semiconductor film is an active layer of a thin film transistor, wherein the semiconductor film comprises a collected body of a plurality of rod-like or flat-rod-like crystals, and wherein the rod-like or flat-rod-like crystals contact each other while forming rotation angles having absolute values that are within 3°.

22. A portable information terminal according to claim 21, wherein the portable information terminal is a mobile computer or a cellular phone.

23. A portable information terminal according to claim 21, wherein the display device is selected from the group consisting of a liquid crystal display device, an electrochromic display device and an electroluminescence display device.

24. A portable information terminal according to claim 21, wherein a main orientation plane of the semiconductor film substantially coincides with a {110} plane.

* * * * *